(12) United States Patent
Yanagigawa et al.

(10) Patent No.: US 9,960,269 B2
(45) Date of Patent: May 1, 2018

(54) SEMICONDUCTOR DEVICE AND METHOD OF MANUFACTURING THE SAME

(71) Applicant: RENESAS ELECTRONICS CORPORATION, Tokyo (JP)

(72) Inventors: Hiroshi Yanagigawa, Hitachinaka (JP); Hiroyoshi Kudou, Hitachinaka (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days. days.

(21) Appl. No.: 15/421,920

(22) Filed: Feb. 1, 2017

(65) Prior Publication Data
US 2017/0222039 A1    Aug. 3, 2017

(30) Foreign Application Priority Data

Feb. 2, 2016   (JP) .................................. 2016-018246
Aug. 23, 2016  (JP) .................................. 2016-162648

(51) Int. Cl.
*H01L 29/78*   (2006.01)
*H01L 29/66*   (2006.01)
*H01L 29/423*  (2006.01)
*H01L 29/10*   (2006.01)
*H01L 21/265*  (2006.01)

(52) U.S. Cl.
CPC .... *H01L 29/7813* (2013.01); *H01L 21/26513* (2013.01); *H01L 29/1095* (2013.01); *H01L 29/4236* (2013.01); *H01L 29/66712* (2013.01)

(58) Field of Classification Search
CPC ........... H01L 29/7813; H01L 29/66712; H01L 21/26513; H01L 29/4236; H01L 29/1095
See application file for complete search history.

(56) References Cited

U.S. PATENT DOCUMENTS 4,837,606 A *  6/1989  Goodman ........... H01L 29/1095
                                                 257/139
7,910,439 B2 *  3/2011  Darwish ........... H01L 29/41766
                                                 438/197
8,643,095 B2 *  2/2014  Suzuki ................ H01L 29/0878
                                                 257/330
8,859,365 B2 * 10/2014  Okumura ............ H01L 21/2257
                                                 257/326
8,928,071 B2 *  1/2015  Shirai ................ H01L 29/0696
                                                 257/330
9,082,835 B2 *  7/2015  Fukui .................. H01L 29/1095
                   (Continued)

FOREIGN PATENT DOCUMENTS

JP    2012-253276 A    12/2012

*Primary Examiner* — Jarrett Stark
*Assistant Examiner* — Charles N Ausar-El
(74) *Attorney, Agent, or Firm* — McDermott Will & Emery LLP

(57) ABSTRACT

A semiconductor device according to one embodiment includes a semiconductor substrate having a main surface and a back surface opposite to the main surface, a drift region of a first conductivity type, a base region of a second conductivity type, a source region of the first conductivity type, and a gate electrode. The semiconductor substrate has a trench in the main surface. The gate electrode is formed in the trench. A distribution of an impurity concentration in the base region has a plurality of peak values along a direction of depth from the main surface toward the back surface, and the number of peak values is four or more.

12 Claims, 24 Drawing Sheets

(56) References Cited

U.S. PATENT DOCUMENTS

| | | | |
|---|---|---|---|
| 9,450,086 B2* | 9/2016 | Shimomura | H01L 29/7813 |
| 9,620,499 B2* | 4/2017 | Hirabayashi | H01L 27/0664 |
| 9,620,632 B2* | 4/2017 | Okawara | H01L 29/7397 |
| 9,837,530 B2* | 12/2017 | Decker | H01L 29/7813 |
| 2006/0131644 A1* | 6/2006 | Saito | H01L 29/0634 |
| | | | 257/329 |
| 2008/0135972 A1* | 6/2008 | Ikuta | H01L 29/1095 |
| | | | 257/492 |
| 2010/0001314 A1* | 1/2010 | Yanagigawa | H01L 27/0705 |
| | | | 257/124 |
| 2012/0307508 A1 | 12/2012 | Fukui et al. | |
| 2013/0264637 A1* | 10/2013 | Katou | H01L 29/7827 |
| | | | 257/331 |
| 2014/0217407 A1* | 8/2014 | Mizushima | H01L 29/32 |
| | | | 257/48 |
| 2014/0231903 A1* | 8/2014 | Willmeroth | H01L 29/0634 |
| | | | 257/330 |
| 2014/0374819 A1* | 12/2014 | Niimura | H01L 29/7827 |
| | | | 257/329 |
| 2015/0270385 A1* | 9/2015 | Shimomura | H01L 29/7813 |
| | | | 257/334 |
| 2016/0181357 A1* | 6/2016 | Yoshida | H01L 29/7813 |
| | | | 257/141 |
| 2017/0317163 A1* | 11/2017 | Yoshimura | H01L 29/063 |

* cited by examiner

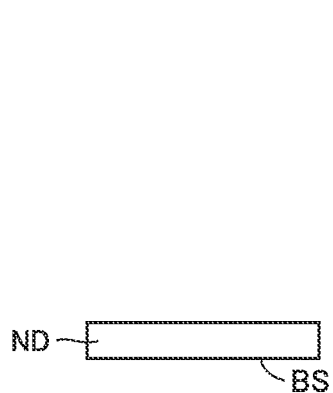
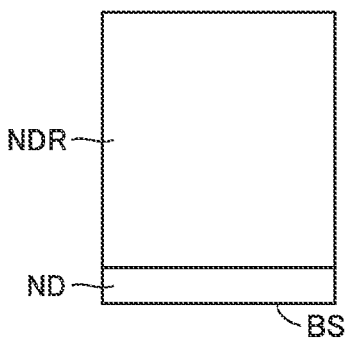
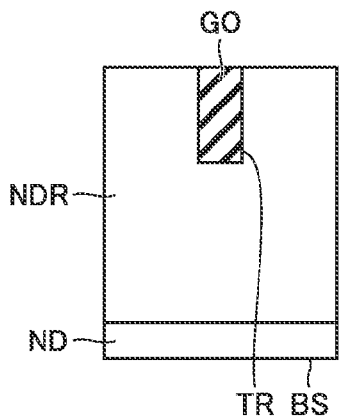
FIG.3A　　　　FIG.3B　　　　FIG.3C
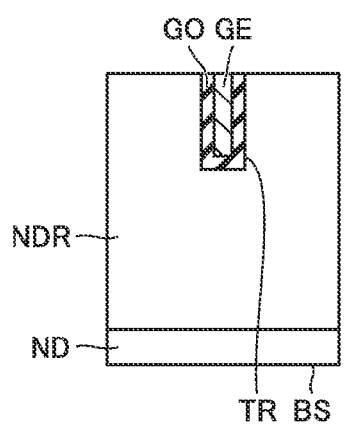
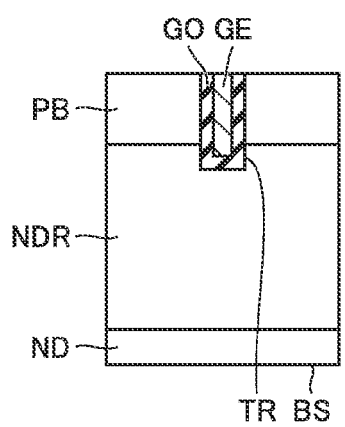
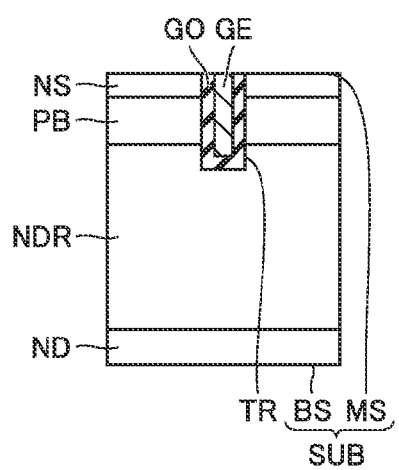
FIG.3D　　　　FIG.3E　　　　FIG.3F
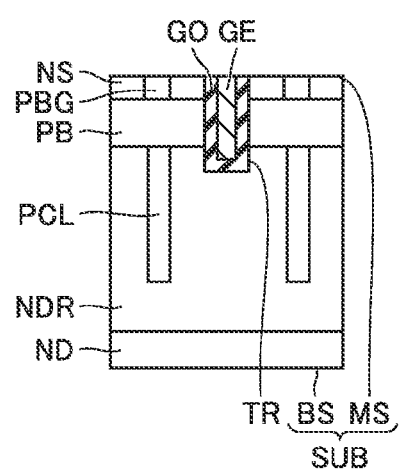
FIG.3G

SEMICONDUCTOR DEVICE AND METHOD OF MANUFACTURING THE SAME

This nonprovisional application is based on Japanese Patent Applications Nos. 2016-018246 and 2016-162648 filed with the Japan Patent Office on Feb. 2 and Aug. 23, 2016, respectively, the entire contents of which are hereby incorporated by reference.

BACKGROUND OF THE INVENTION

Field of the Invention

The present invention relates to a semiconductor device and a method of manufacturing the same and particularly to a power semiconductor device and a method of manufacturing the same.

Description of the Background Art

A vertical structure of a power semiconductor device in which a current flows from a side of a main surface of a substrate toward a back surface of the substrate is the mainstream. A vertical metal oxide semiconductor field effect transistor (MOSFET) represents such a power semiconductor device having a vertical structure.

A vertical trench gate type MOSFET has an n-type drain region formed on a back surface of a substrate, an n-type drift region formed on an n-type drain, a p-type base region formed in the n-type drift region, an n-type source region formed in the p-type base region and at a main surface of the substrate, and a gate electrode opposed to the p-type base region with a gate insulating film being interposed. A trench formed in the main surface of the substrate is filled with the gate electrode.

A method of implanting ions in three stages with an implantation depth being varied and thereafter performing heat treatment is available as a method of forming such a p-type base region (for example, Japanese Patent Laying-Open No. 2012-253276).

SUMMARY OF THE INVENTION

In general, in order to secure a safe operation region of a power semiconductor device, a channel length should be long. In the vertical trench gate type MOSFET, a channel length is determined by a depth of a p-type base region.

In the method of forming a p-type base region described in Patent Document 1, however, ions are implanted in three stages. Therefore, in an attempt to form a p-type base region to a large thickness, a distance between locations where ions are to be implanted is long. Consequently, a steep gradient of an impurity concentration is formed in the p-type base region. The steep gradient of the impurity concentration brings about a gradient of a potential in the p-type base region.

In a vertical MOSFET, an npn type parasitic bipolar transistor is formed by an n-type source region, a p-type base region, and an n-type drift region. A difference in potential based on a steep gradient of an impurity concentration in the p-type base region is set as a base voltage of the parasitic bipolar transistor. Therefore, if a steep gradient of an impurity concentration is formed in the p-type base region, the parasitic bipolar transistor will operate. Such an operation of the parasitic bipolar transistor becomes a factor for narrowing of a safe operation region of a power semiconductor element.

Other objects and novel features will become apparent from the description herein and the accompanying drawings.

A semiconductor device according to one embodiment includes a semiconductor substrate having a main surface and a back surface opposite to the main surface, a drift region of a first conductivity type disposed in the semiconductor substrate, a base region of a second conductivity type disposed in the semiconductor substrate on a side of the main surface relative to the drift region, a source region of the first conductivity type disposed in the semiconductor substrate on the side of the main surface relative to the drift region such that the base region lies between the source region and the drift region, and a gate electrode opposed to the base region lying between the source region and the drift region, with the gate electrode being insulated from the base region. The semiconductor substrate has a trench in the main surface. The gate electrode is formed in the trench. A distribution of an impurity concentration in the base region has a plurality of peak values along a direction of a depth from the main surface toward the back surface. The number of peak values is four or more.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 3A to 3G are cross-sectional views in a front end process in the first embodiment.

DESCRIPTION OF THE PREFERRED EMBODIMENTS

Figure 1:
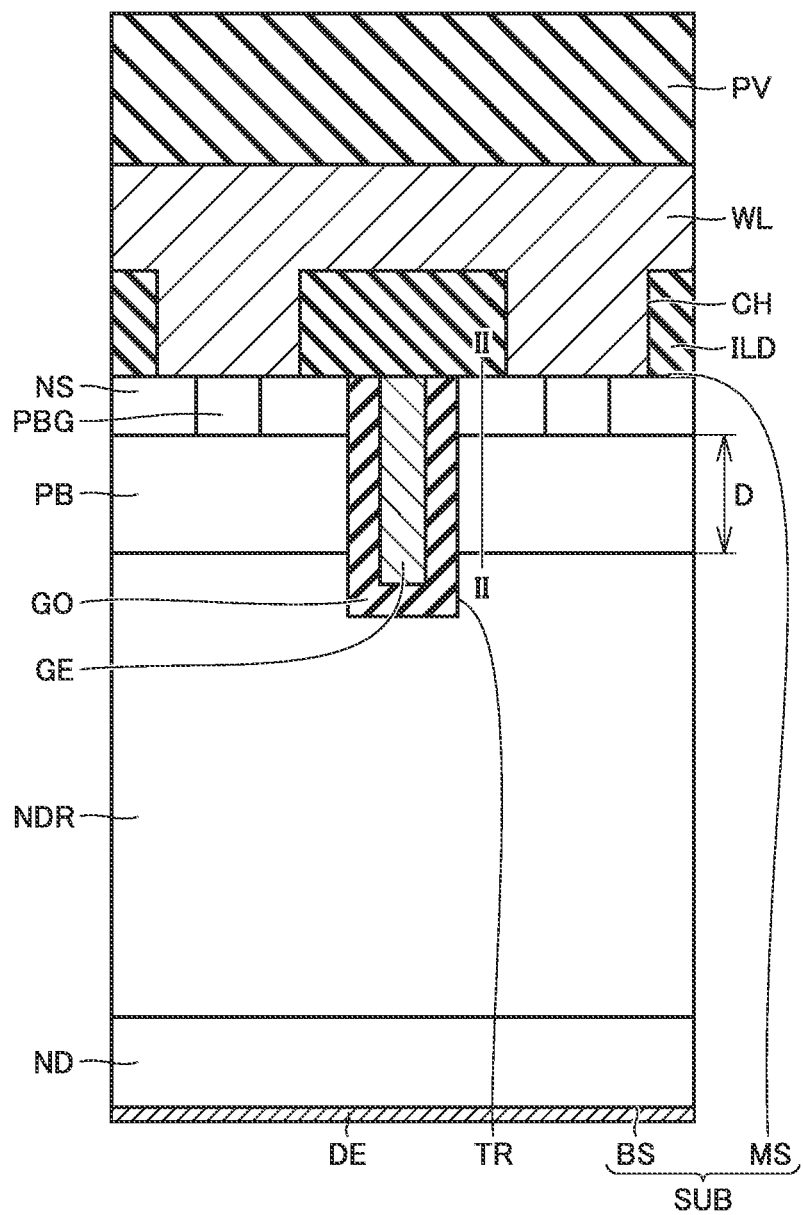
FIG. 1 is a cross-sectional view of a semiconductor device according to a first embodiment.

An embodiment will be described hereinafter with reference to the drawings. The same or corresponding elements in the drawings below have the same reference characters allotted. At least a part of the embodiment described below may arbitrarily be combined.

First Embodiment

A structure of a semiconductor device according to a first embodiment will be described below.

As shown in FIG. 1, the semiconductor device according to the first embodiment mainly has a semiconductor substrate SUB, a metal insulator semiconductor transistor (MISFET), an interlayer insulating film ILD, an interconnection WL, and a protecting film PV.

Semiconductor substrate SUB has a main surface MS and a back surface BS opposite to main surface MS. For example, single-crystal silicon (Si) is employed for semiconductor substrate SUB. A MISFET is formed in semiconductor substrate SUB. The MISFET has an n-type drain region ND, an n-type drift region NDR, a p-type base region PB, an n-type source region NS, a p-type back gate region PBG, a gate insulating film GO, and a gate electrode GE.

In semiconductor substrate SUB, n-type drain region ND is formed as being in contact with back surface BS. On back surface BS, a drain electrode DE is formed as being in contact with n-type drain region ND. In semiconductor substrate SUB, n-type drift region NDR is formed on a side of main surface MS relative to n-type drain region ND. A p-type region may be formed instead of the n-type drain region. In this case, the semiconductor device according to the first embodiment is an insulated gate bipolar transistor (IGBT). In semiconductor substrate SUB, p-type base region PB is formed on the side of main surface MS relative to n-type drift region NDR. P-type base region PB has a depth D. Depth D refers to a distance between a side of p-type base region PB in contact with n-type source region NS and a side of p-type base region PB in contact with n-type drift region NDR. Depth D is preferably not smaller than 1.0 μm. Depth D is further preferably not smaller than 1.5 μm.

In the semiconductor device according to the first embodiment, a channel is formed along an interface between p-type base region PB and gate insulating film GO. Therefore, as depth D of p-type base region PB is greater, a channel length is longer. As depth D of p-type base region PB is greater, a safe operation region of the semiconductor device in the first embodiment is greater. Increase in channel length, however, leads to increase in channel resistance. Therefore, depth D of p-type base region PB is preferably not greater than 2.0 μm.

In semiconductor substrate SUB, n-type source region NS and p-type back gate region PBG are formed as being in contact with main surface MS on the side of the main surface relative to p-type base region PB. In other words, n-type source region NS is formed such that the p-type base region lies between the n-type source region and the n-type drift region. N-type source regions NS are disposed at a distance from each other. P-type back gate region PBG is formed as being surrounded by n-type source regions NS.

A trench TR is provided in main surface MS of semiconductor substrate SUB. Trench TR is provided between n-type source regions NS. Trench TR is provided to extend from main surface MS of semiconductor substrate SUB toward back surface BS of semiconductor substrate SUB. Trench TR passes through each of n-type source region NS and p-type base region PB and reaches n-type drift region NDR.

Gate electrode GE is formed in trench TR. For example, polycrystalline silicon in which an impurity has been introduced is employed for gate electrode GE. Gate insulating film GO is formed between gate electrode GE and a surface of trench TR. For example, silicon dioxide ($SiO_2$) is employed for gate insulating film GO. Thus, gate electrode GE is opposed to p-type base region PB lying between n-type source region NS and n-type drift region NDR with the gate electrode being insulated from the p-type base region.

Interlayer insulating film ILD is formed on main surface MS of semiconductor substrate SUB. For example, silicon dioxide is employed for interlayer insulating film ILD. A contact hole CH is provided in interlayer insulating film ILD. Contact hole CH is provided over n-type source region NS and p-type back gate region PBG.

Though not shown in FIG. 1, contact hole CH is provided also over gate electrode GE. Thus, n-type source region NS, p-type back gate region PBG, and gate electrode GE are exposed through interlayer insulating film ILD.

Interconnection WL is formed on main surface MS of semiconductor substrate SUB and interlayer insulating film ILD. Thus, interconnection WL is electrically connected to n-type source region NS, p-type back gate region PBG, and gate electrode GE. For example, aluminum (Al) or an aluminum alloy is employed for interconnection WL.

Protecting film PV is formed on interconnection WL. For example, silicon nitride (SiN) is employed for protecting film PV.

A distribution of an impurity concentration in semiconductor substrate SUB in the semiconductor device according to the first embodiment will be described below.

N-type source region NS and n-type drain region ND are preferably higher in impurity concentration than n-type drift region NDR.

A distribution of an impurity concentration in p-type base region PB has a plurality of peak values along a direction of depth D (that is, a direction from main surface MS toward back surface BS). There are four or more peak values in the distribution of the impurity concentration in p-type base region PB. When p-type base region PB has depth D not smaller than 1.5 μm, there are preferably five or more peak values in the distribution of the impurity concentration in p-type base region PB. In the following, the peak values are defined as a first peak value P1, a second peak value P2, a third peak value P3, and a fourth peak value P4 in the order of proximity to main surface MS of semiconductor substrate SUB.

An interval between a position where first peak value P1 is attained and a position where second peak value P2 is attained, an interval between the position where second peak value P2 is attained and a position where third peak value P3 is attained, and an interval between the position where third peak value P3 is attained and a position where a fourth peak value is attained are preferably equal to one another along the direction of depth D. Thus, formation of a steep concentration gradient in the distribution of the impurity concentration in p-type base region PB can further be suppressed.

Figure 2:
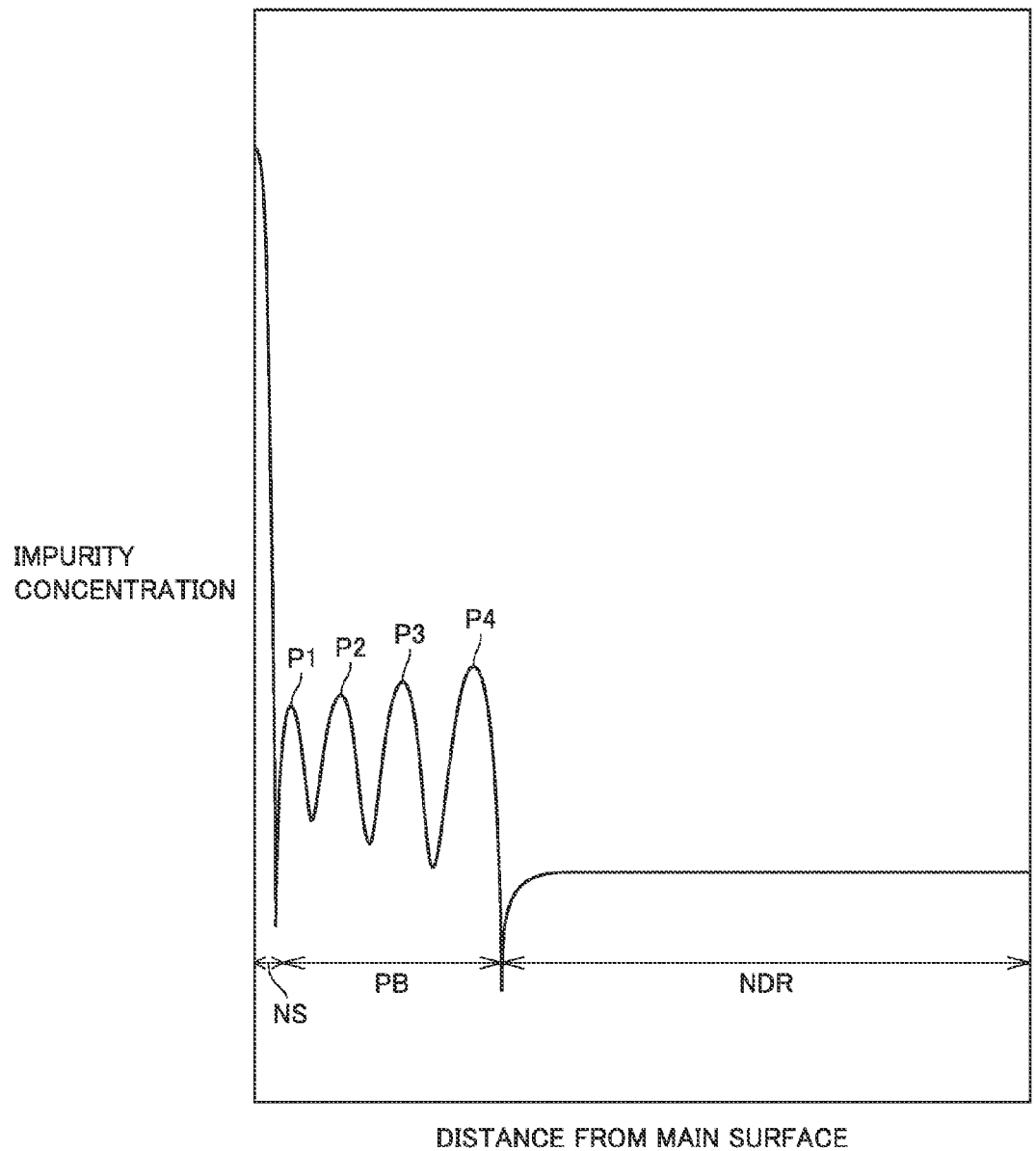
FIG. 2 is a schematic diagram showing change in impurity concentration along II-II in FIG. 1.

As shown in FIG. 2, first peak value P1 is preferably smaller than at least any one of second peak value P2 to fourth peak value P4.

A threshold voltage of the semiconductor device according to the first embodiment is determined by a maximum value of first peak value P1 to fourth peak value. The position where first peak value P1 is attained is located at a position closest to main surface MS of semiconductor substrate SUB. In other words, the position where first peak value P1 is attained is located at a position closest to the n-type source region.

An impurity concentration in n-type source region NS is relatively high. Therefore, first peak value P1 is likely to be affected by n-type source region NS. Consequently, when first peak value P1 is the maximum of the impurity concentration in p-type base region PB, the threshold voltage fluctuates due to influence by n-type source region NS. Therefore, preferably, any of second peak value P2 to fourth peak value P4 is the maximum of the impurity concentration in p-type base region PB. A peak value other than the peak value located closest to main surface MS is preferably the maximum of the impurity concentration in p-type base region PB.

First peak value P1 to fourth peak value P4 preferably satisfy relation of first peak value P1<second peak value P2<third peak value P3<fourth peak value P4. First peak value P1 to fourth peak value P4 preferably exhibit increase with a greater distance from main surface MS of semiconductor substrate SUB (that is, a longer distance from main surface MS). Thus, formation of a steep concentration gradient in the distribution of the impurity concentration in p-type base region PB can further be suppressed.

First peak value P1 to fourth peak value P4 preferably exhibit linear increase in accordance with a distance from the main surface of semiconductor substrate SUB. Change from first peak value P1 to fourth peak value P4 preferably exhibits increase in proportion to a distance between positions where peak values are attained. Thus, formation of a steep concentration gradient in the distribution of the impurity concentration in p-type base region PB can further be suppressed.

A method of manufacturing a semiconductor device according to the first embodiment will be described below.

The method of manufacturing a semiconductor device according to an embodiment has a front end process S1 and a back end process S2.

Front end process S1 has a preparation step S11, a drift region forming step S12, a trench forming step S13, a gate forming step S15, a base region forming step S16, a source region forming step S17, and a back gate region forming step S18. Back end process S2 has an interlayer insulating film forming step S21, an interconnection forming step S22, and a protecting film forming step S23.

FIG. 3A is a cross-sectional view of a semiconductor device in preparation step S11. In preparation step S11, as shown in FIG. 3A, semiconductor substrate SUB having n-type drain region ND formed is prepared.

FIG. 3B is a cross-sectional view of a semiconductor device in drift region forming step S12. In drift region forming step S12, as shown in FIG. 3B, n-type drift region NDR is formed on n-type drain region ND. N-type drift region NDR is formed, for example, through epitaxial growth with chemical vapor deposition (CVD).

FIG. 3C is a cross-sectional view of a semiconductor device in trench forming step S13. In trench forming step S13, as shown in FIG. 3C, trench TR and gate insulating film GO are formed in n-type drift region NDR.

Trench TR is formed, for example, through reactive ion etching (RIE). Gate insulating film GO in trench TR is formed, for example, by depositing gate insulating film GO through CVD and removing gate insulating film GO which extends off trench TR by chemical mechanical polishing (CMP).

FIG. 3D is a cross-sectional view of a semiconductor device in gate forming step S15. In gate forming step S15, gate electrode GE is formed as shown in FIG. 3D. Gate electrode GE is formed, for example, by providing a trench through RIE, depositing gate electrode GE in the trench with CVD, and removing gate electrode GE which extends off the trench by CMP.

FIG. 3E is a cross-sectional view of a semiconductor device in base region forming step S16. In base region forming step S16, as shown in FIG. 3E, p-type base region PB is formed in n-type drift region NDR. P-type base region PB is formed by implanting ions a plurality of times and performing heat treatment.

An amount of dose in a plurality of times of implantation of ions is set, for example, to $7 \times 10^{12}/cm^2$. The number of times of implantation of ions is set preferably to four and it may be five or more. A plurality of times of implantation of ions are varied in depth of implantation, by varying an acceleration voltage, for example, to 700 KeV, 500 KeV, 300 KeV, and 100 KeV. A time period for implantation of ions in each stage is longer as ions are implanted at a higher voltage (into a deeper position). In other words, as ions are implanted at a higher voltage (into a deeper position), an amount of implantation of ions is greater.

FIG. 3F is a cross-sectional view of a semiconductor device in source region forming step S17. In source region forming step S17, as shown in FIG. 3F, n-type source region NS is formed on the side of main surface MS of semiconductor substrate SUB relative to p-type base region PB. N-type source region NS is formed, for example, through implantation of ions.

FIG. 3G is a cross-sectional view of a semiconductor device in back gate region forming step S18. In back gate region forming step S18, as shown in FIG. 3G, p-type back gate region PBG is formed in n-type source region NS. P-type back gate region PBG is formed, for example, through implantation of ions. Front end process S1 is completed through the steps above.

Figure 4A:
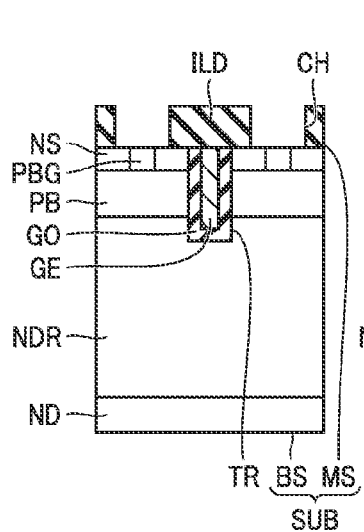
FIGS. 4A to 4C are cross-sectional views in a back end process in the first embodiment.

FIG. 4A is a cross-sectional view of a semiconductor device in interlayer insulating film forming step S21. In interlayer insulating film forming step S21, as shown in FIG. 4A, interlayer insulating film ILD having contact hole CH is formed on main surface MS. Interlayer insulating film ILD is formed, for example, through CVD. Contact hole CH is provided, for example, through RIE.

Figure 4B:
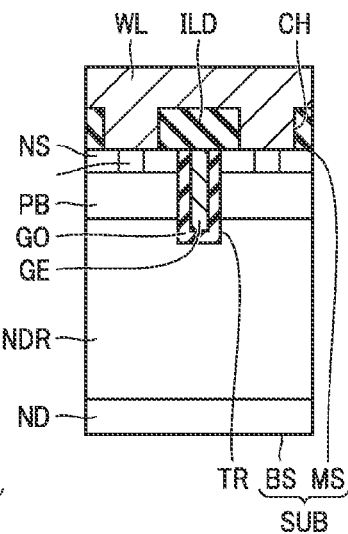

FIG. 4B is a cross-sectional view of a semiconductor device in interconnection forming step S22. In interconnection forming step S22, as shown in FIG. 4B, interconnection WL is formed on interlayer insulating film ILD, n-type source region NS, p-type back gate region PBG, and the gate electrode. Interconnection WL is formed, for example, by film formation through sputtering and patterning through photolithography and etching.

Figure 4C:
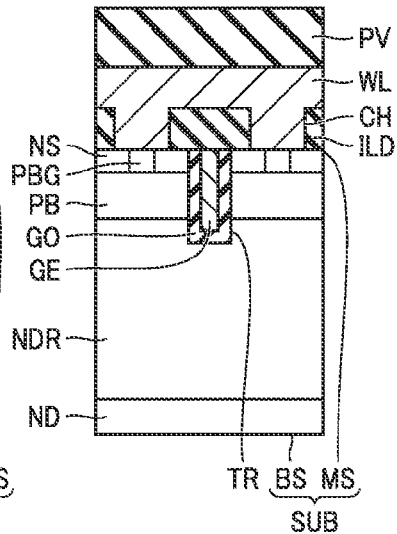

FIG. 4C is a cross-sectional view of a semiconductor device in protecting film forming step S23. In protecting film forming step S23, as shown in FIG. 4C, protecting film PV is formed. Protecting film PV is formed, for example, through CVD.

An effect of the semiconductor device according to the first embodiment will be described below.

In the semiconductor device according to the first embodiment, the distribution of the impurity concentration in p-type base region PB has four or more peak values. Therefore, an interval between positions where peak values are attained is narrow. Therefore, even though depth D of p-type base region PB is great, a steep gradient of an impurity concentration in the distribution of the impurity concentration in p-type base region PB is less likely. Consequently, a safe operation region can be secured in the semiconductor device according to the first embodiment.

Second Embodiment

A structure of a semiconductor device according to a second embodiment will be described below. A difference from the first embodiment will mainly be described here.

A structure of the semiconductor device according to the second embodiment will be described below.

Figure 5:
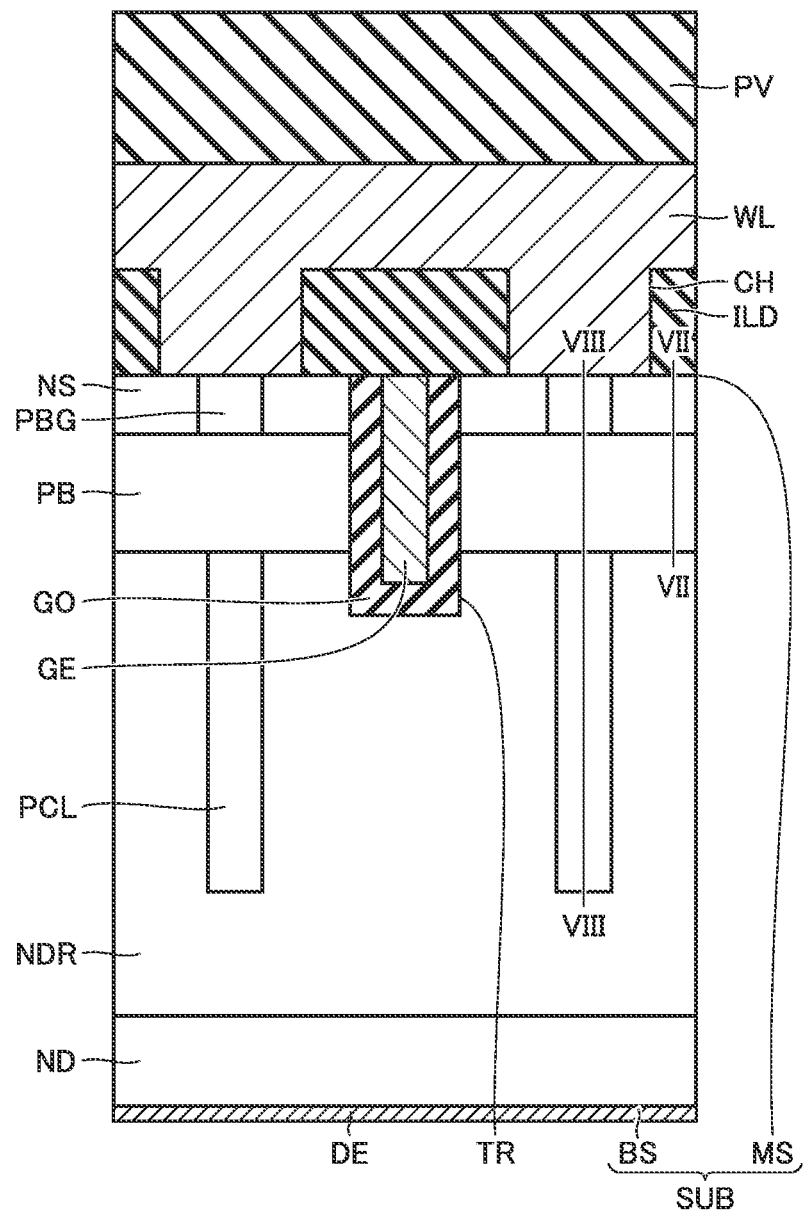
FIG. 5 is a cross-sectional view of a semiconductor device according to a second embodiment.

As shown in FIG. 5, the semiconductor device according to the second embodiment has semiconductor substrate SUB, a MISFET, interlayer insulating film ILD, interconnection WL, and protecting film PV similarly to the semiconductor device according to the first embodiment.

Semiconductor substrate SUB has the MISFET formed as in the semiconductor device according to the first embodiment. The MISFET has n-type drain region ND, n-type drift region NDR, p-type base region PB, n-type source region NS, and p-type back gate region PBG as in the semiconductor device according to the first embodiment. In addition thereto, a p-type column region PCL is formed in semiconductor substrate SUB.

P-type column region PCL extends in semiconductor substrate SUB from p-type base region PB toward back surface BS of semiconductor substrate SUB.

Figure 6:
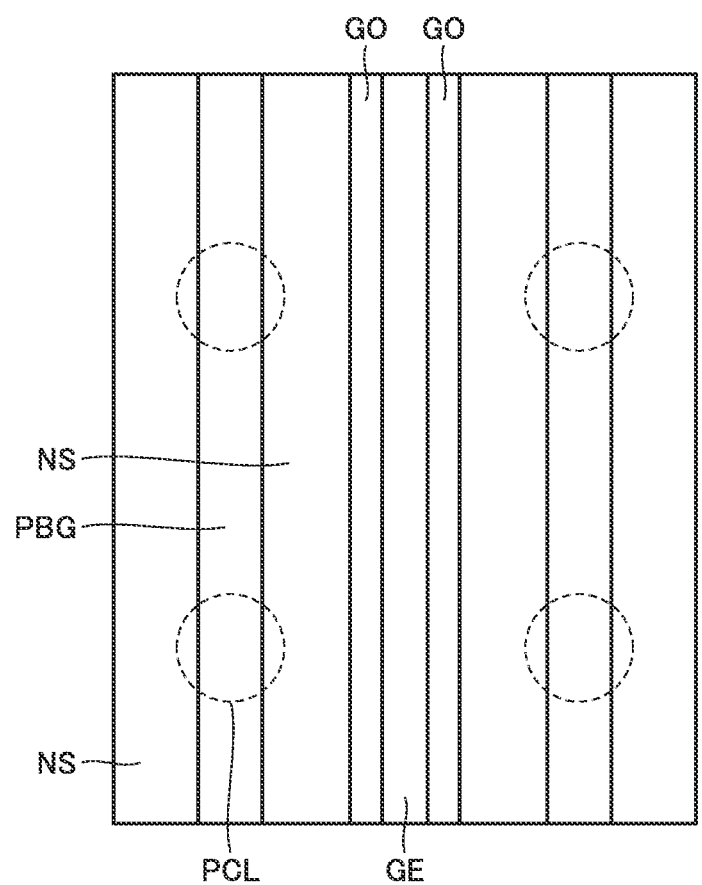
FIG. 6 is a top view of the semiconductor device according to the second embodiment.

As shown in FIG. 6, p-type column region PCL is circular when viewed in a direction perpendicular to main surface MS of semiconductor substrate SUB.

A shape of p-type column region PCL is not limited as such. P-type column region PCL may be in a square or rectangular shape when viewed in the direction perpendicular to main surface MS of semiconductor substrate SUB. P-type column region PCL may be in a stripe shape when viewed in the direction perpendicular to main surface MS of semiconductor substrate SUB. P-type column regions PCL may be arranged as being staggered when viewed in the direction perpendicular to main surface MS of semiconductor substrate SUB. P-type column region PCL may be in any shape so long as charge balance with n-type drift region NDR is kept.

A distribution of an impurity concentration in semiconductor substrate SUB in the semiconductor device according to the second embodiment will be described below.

N-type drift region NDR has an impurity concentration preferably not lower than $1 \times 10^{16}/cm^3$ and not higher than $1 > 10^{17}/cm^3$. Thus, an electrical resistance value of the n-type drift region lowers. An on-resistance of the semiconductor device according to the second embodiment can be lower.

As the impurity concentration in n-type drift region NDR is higher, a depletion layer formed by the pn junction between n-type drift region NDR and p-type base region PB is less likely to extend in n-type drift region NDR. Therefore, normally, when the impurity concentration in n-type drift region NDR is higher, a breakdown voltage lowers. In the semiconductor device according to the second embodiment, however, p-type column region PCL is formed. Therefore, since the depletion layer is formed in n-type drift region NDR owing to the pn junction between n-type drift region NDR and p-type column region PCL, lowering in breakdown voltage is less likely.

P-type column region PCL is preferably higher in impurity concentration than p-type base region PB. More specifically, the impurity concentration in p-type column region PCL is preferably higher than any of first peak value P1 to fourth peak value P4 in the distribution of the impurity concentration in p-type base region PB.

Figure 7:
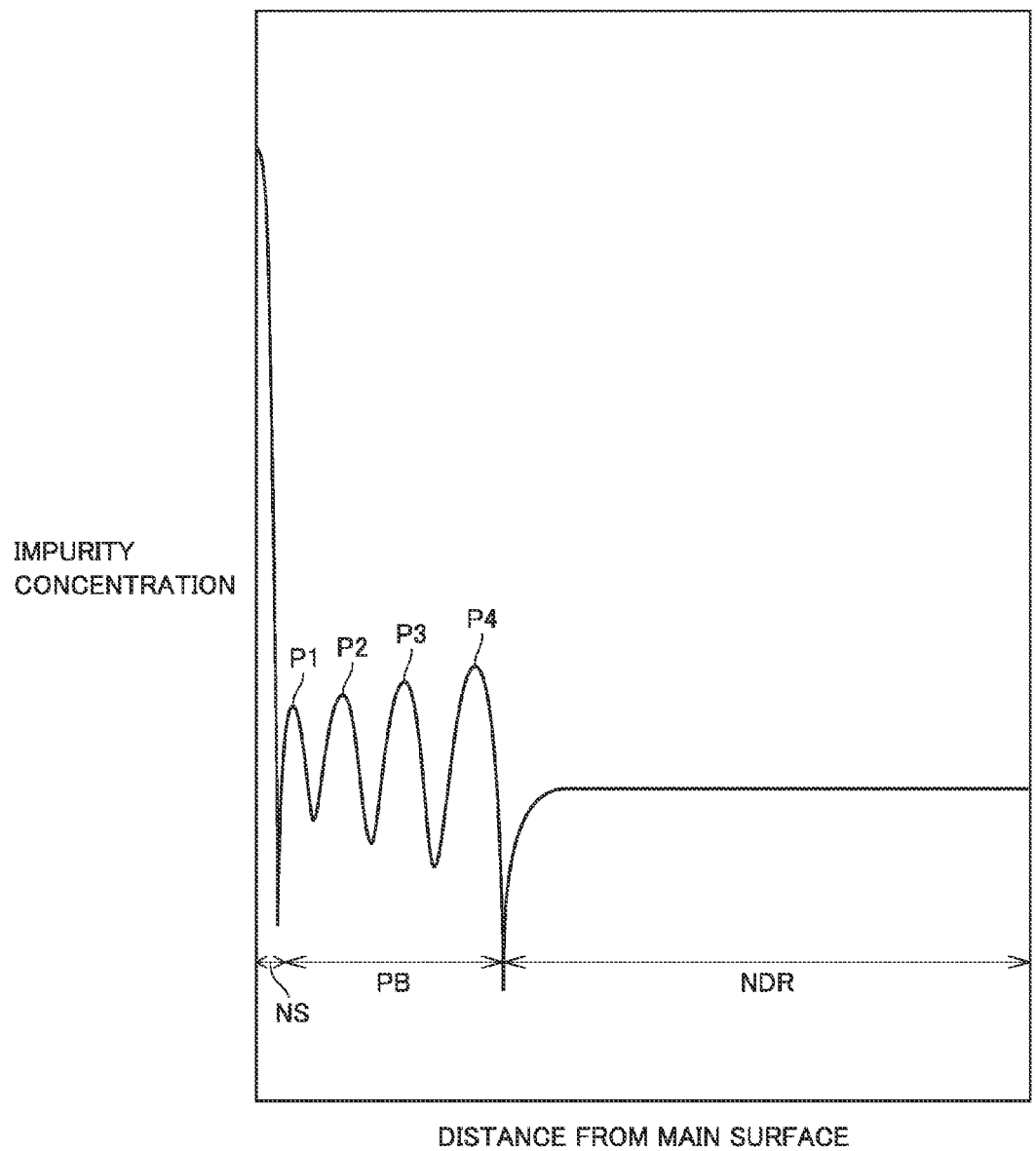
FIG. 7 is a schematic diagram showing change in impurity concentration along VII-VII in FIG. 5.

As shown in FIG. 7, the distribution of the impurity concentration in p-type base region PB has first peak value P1, second peak value P2, third peak value P3, and fourth peak value P4 as in the semiconductor device according to the first embodiment.

First peak value P1 to fourth peak value P4 in the distribution of the impurity concentration in the p-type base region preferably satisfy relation of first peak value P1<second peak value P2<third peak value P3<fourth peak value P4.

Figure 8:
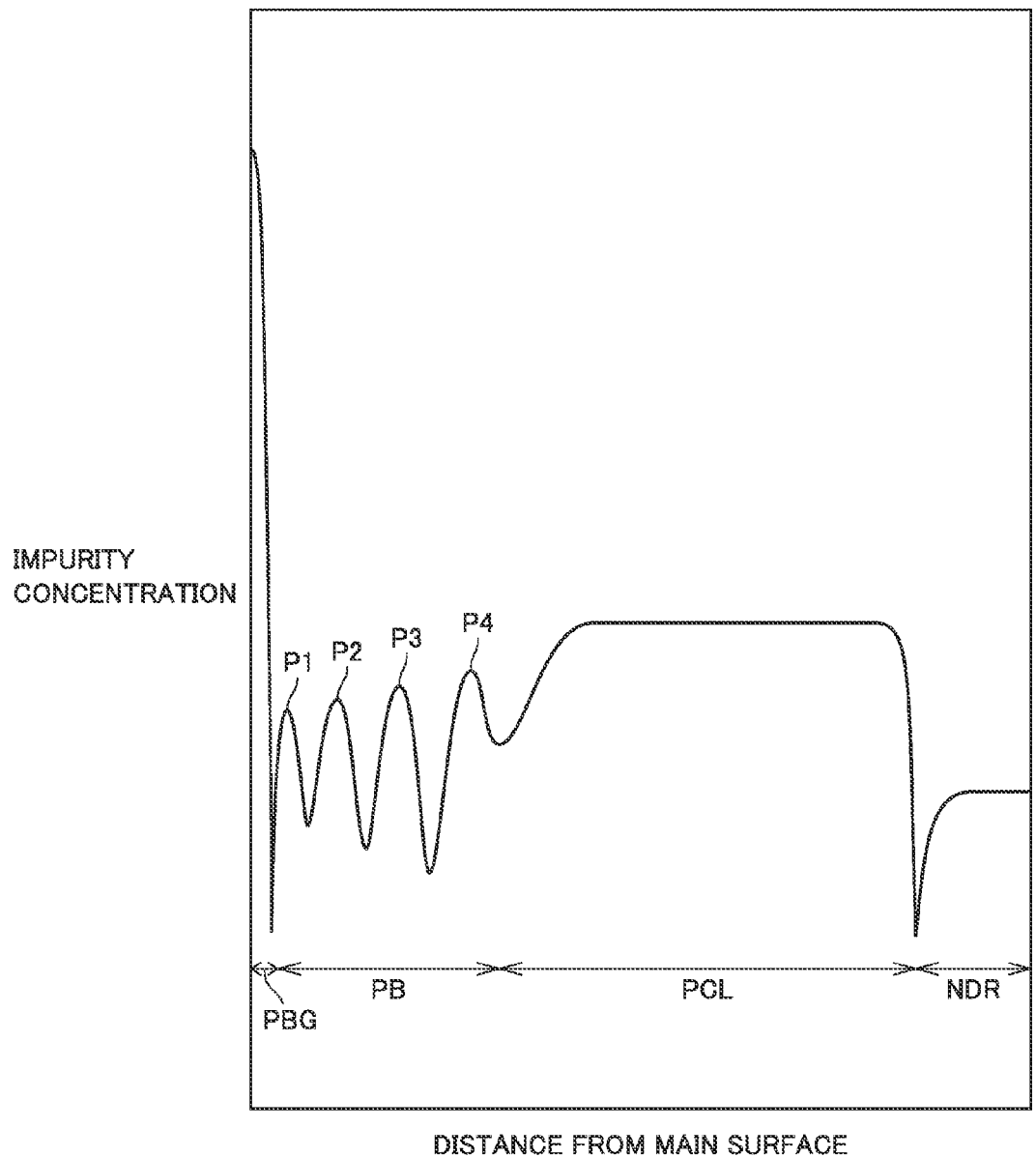
FIG. 8 is a schematic diagram showing change in impurity concentration along VIII-VIII in FIG. 5.

As shown in FIG. 8, preferably, first peak value P1 to fourth peak value P4 are closer to the impurity concentration in p-type column region PCL as a distance from main surface MS of semiconductor substrate SUB is greater (that is, a distance from main surface MS is longer).

When the impurity concentration in p-type base region PB on the side of back surface BS is significantly different from the impurity concentration in p-type column region PCL, a steep gradient in impurity concentration may be formed in the vicinity of a boundary between p-type base region PB and p-type column region PCL.

Such a steep gradient of the impurity concentration causes an operation of a parasitic bipolar transistor. Therefore, as p-type base region PB has peaks of the impurity concentration as above, a safe operation region can be secured.

A method of manufacturing a semiconductor device according to the second embodiment will be described below.

The method of manufacturing a semiconductor device according to the second embodiment is different from the method of manufacturing a semiconductor device according to the first embodiment in that a column region forming step S14 is performed after trench forming step S13 is performed and before gate forming step S15 is performed.

The method of manufacturing a semiconductor device according to the second embodiment is different from the method of manufacturing a semiconductor device according to the first embodiment in heat treatment in base region forming step S16.

Column region forming step S14 will initially be described below.

Figure 9:
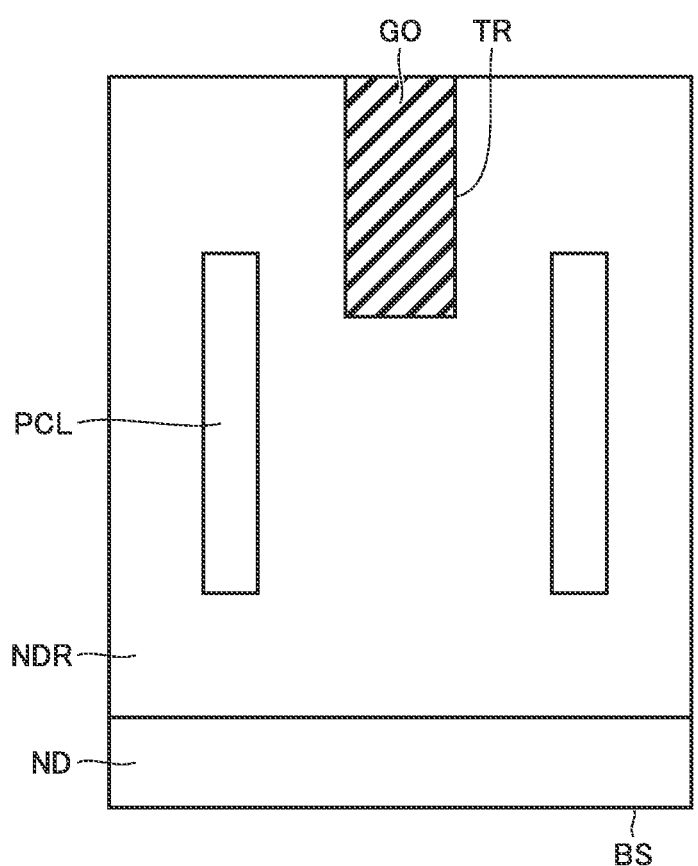
FIG. 9 is a cross-sectional view in a column region forming step in the second embodiment.

As shown in FIG. 9, in column region forming step S14, p-type column region PCL is formed in n-type drain region ND.

P-type column region PCL is formed, for example, by implanting ions a plurality of times and performing heat treatment. Thus, the pn junction between p-type column region PCL and n-type drift region NDR is formed. An amount of dose in a plurality of times of implantation of ions is set, for example, to $3\times10^{13}/cm^2$. A plurality of times of implantation of ions are varied in depth of implantation by varying an acceleration voltage, for example, to 2400 KeV, 1800 KeV, and 100 KeV.

Base region forming step S16 will now be described below.

As in the method of manufacturing a semiconductor device according to the first embodiment, p-type base region PB is formed in base region forming step S16. P-type base region PB is formed by implanting ions a plurality of times and performing heat treatment as in the method of manufacturing a semiconductor device according to the first embodiment. Thus, the pn junction between p-type base region PB and n-type drift region NDR is formed.

In the method of manufacturing a semiconductor device according to the second embodiment, a temperature for heat treatment in base region forming step S16 is preferably not lower than 800° C. and not higher than 900° C. A time period for heat treatment in base region forming step S16 is preferably within 60 minutes.

An interval between p-type column regions PCL is set in order to secure charge balance between p-type column region PCL and n-type drift region NDR. When heat treatment is performed at a high temperature or for a long period of time after p-type column region PCL is once formed, diffusion of an impurity in semiconductor substrate SUB proceeds and a width of p-type column region PCL becomes greater. Consequently, an interval between p-type column regions PCL varies. Therefore, heat treatment in base region forming step S16 of the semiconductor device according to the second embodiment is preferably performed within the temperature range and the range of the heat treatment time period as above.

An effect of the semiconductor device according to the second embodiment will be described below.

Semiconductor substrate SUB in a semiconductor device according to a first comparative example has n-type drain region ND, n-type drift region NDR, p-type base region PB, p-type column region PCL, n-type source region NS, and p-type back gate region PBG as in the semiconductor device according to the embodiment of the semiconductor device according to the second embodiment.

P-type base region PB in the semiconductor device according to the first comparative example has depth D not smaller than 1.0 μm and not greater than 2.0 μm. An impurity concentration in n-type drift region NDR in the semiconductor device according to the first comparative example is not lower than $1\times10^{16}/cm^3$ and not higher than $1\times10^{17}/cm^3$.

The semiconductor device according to the first comparative example is subjected to heat treatment at a temperature not lower than 800° C. and not higher than 900° C. for a time period within 60 minutes in base region forming step S16, similarly to the semiconductor device according to the second embodiment.

In the semiconductor device according to the first comparative example, however, there are three peak values in the distribution of the impurity concentration in p-type base region PB, unlike p-type base region PB in the semiconductor device according to the second embodiment.

Figure 10:
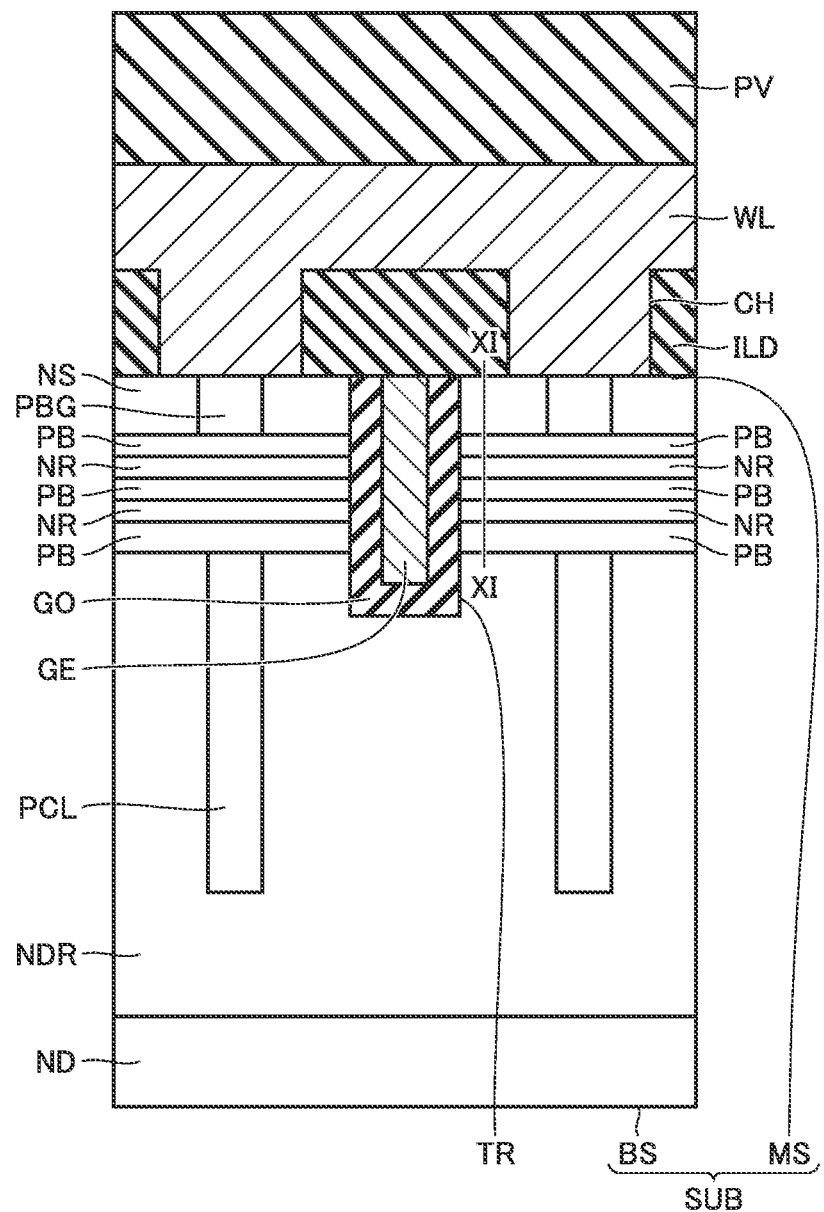
FIG. 10 is a cross-sectional view of a semiconductor device according to a first comparative example.
Figure 11:
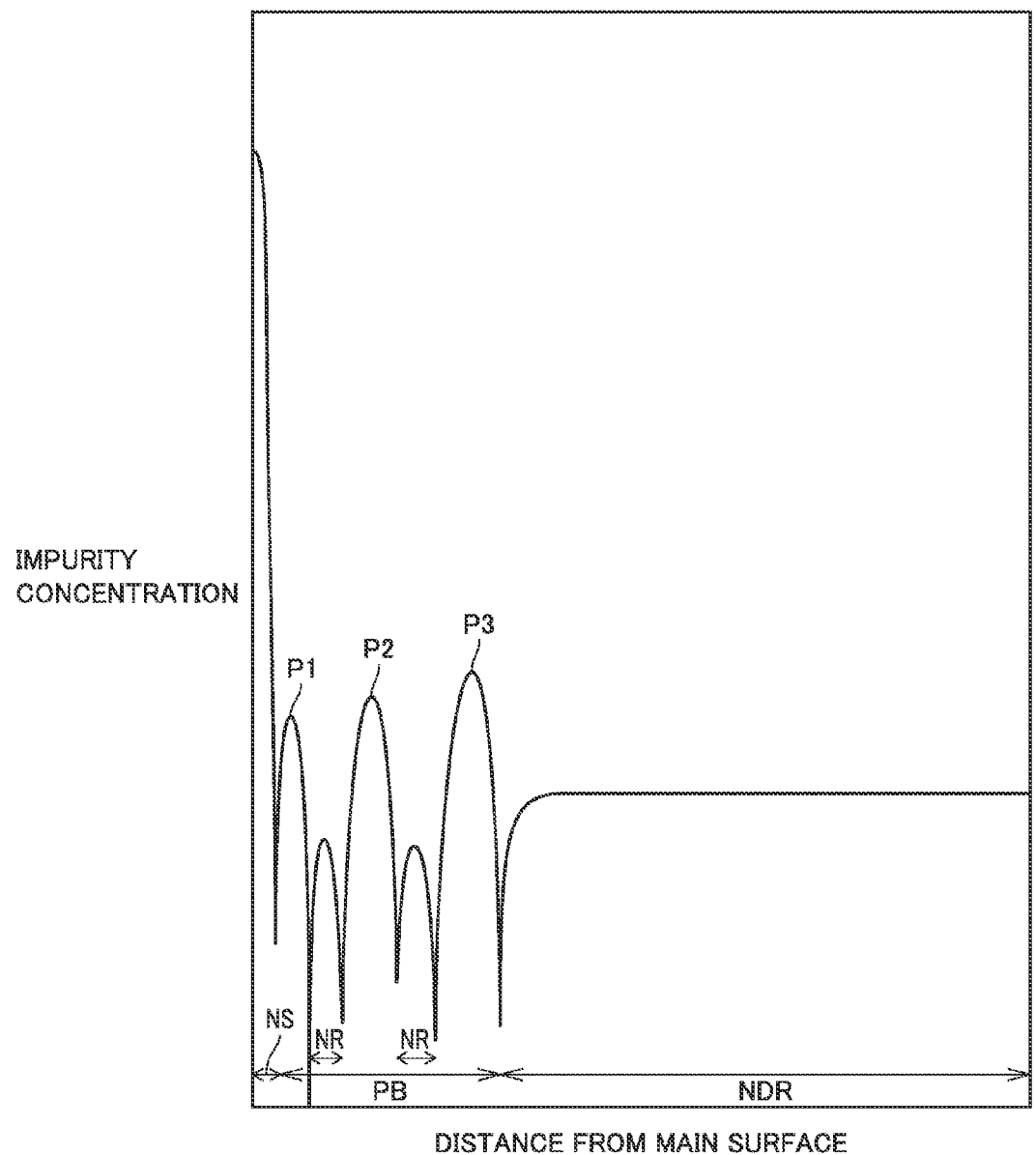
FIG. 11 is a schematic diagram showing change in impurity concentration along XI-XI in FIG. 10.

As shown in FIGS. 10 and 11, p-type base region PB in the semiconductor device according to the first comparative example has an n-type region NR.

In spite of depth D of p-type base region PB in the semiconductor device according to the first comparative example being as great as 1.0 μm or more, there are three peak values in the distribution of the impurity concentration in p-type base region PB. An interval between positions where peak values are attained in the distribution of the impurity concentration in p-type base region PB has become great. The impurity concentration in n-type drift region NDR in the semiconductor device according to the first comparative example is not lower than $1\times10^{16}/cm^3$ and not higher than $1\times10^{17}/cm^3$. Furthermore, a condition for heat treatment is also restricted to a temperature not lower than 800° C. and not higher than 900° C. and a time period within 60 minutes.

Therefore, diffusion of an impurity sufficient for converting n-type drift region NDR between positions where peak values are attained in the distribution of the impurity concentration in p-type base region PB to the p-type is not achieved by heat treatment. Consequently, n-type region NR may remain in p-type base region PB and p-type base region PB cannot normally be formed.

Even when n-type region NR does not remain in p-type base region PB, a steep concentration gradient is formed between positions where peak values are attained in the distribution of the impurity concentration in p-type base region PB.

A second comparative example will now be described.

Semiconductor substrate SUB in a semiconductor device according to the second comparative example has n-type drain region ND, n-type drift region NDR, p-type base region PB, p-type column region PCL, n-type source region NS, and p-type back gate region PBG as in the semiconductor device according to the second embodiment. An impurity concentration in n-type drift region NDR in the semiconductor device according to the second comparative example is not lower than $1\times10^{16}/cm^3$ and not higher than $1\times10^{17}/cm^3$.

The semiconductor device according to the second comparative example is subjected to heat treatment at a temperature not lower than 800° C. and not higher than 900° C. for a time period within 60 minutes in base region forming step S16 similarly to the semiconductor device according to the second embodiment.

In the semiconductor device according to the second comparative example, however, there are three peak values in the distribution of the impurity concentration in p-type base region PB. P-type base region PB in the semiconductor device according to the second comparative example has depth D smaller than 1.0 μm.

Figure 12:
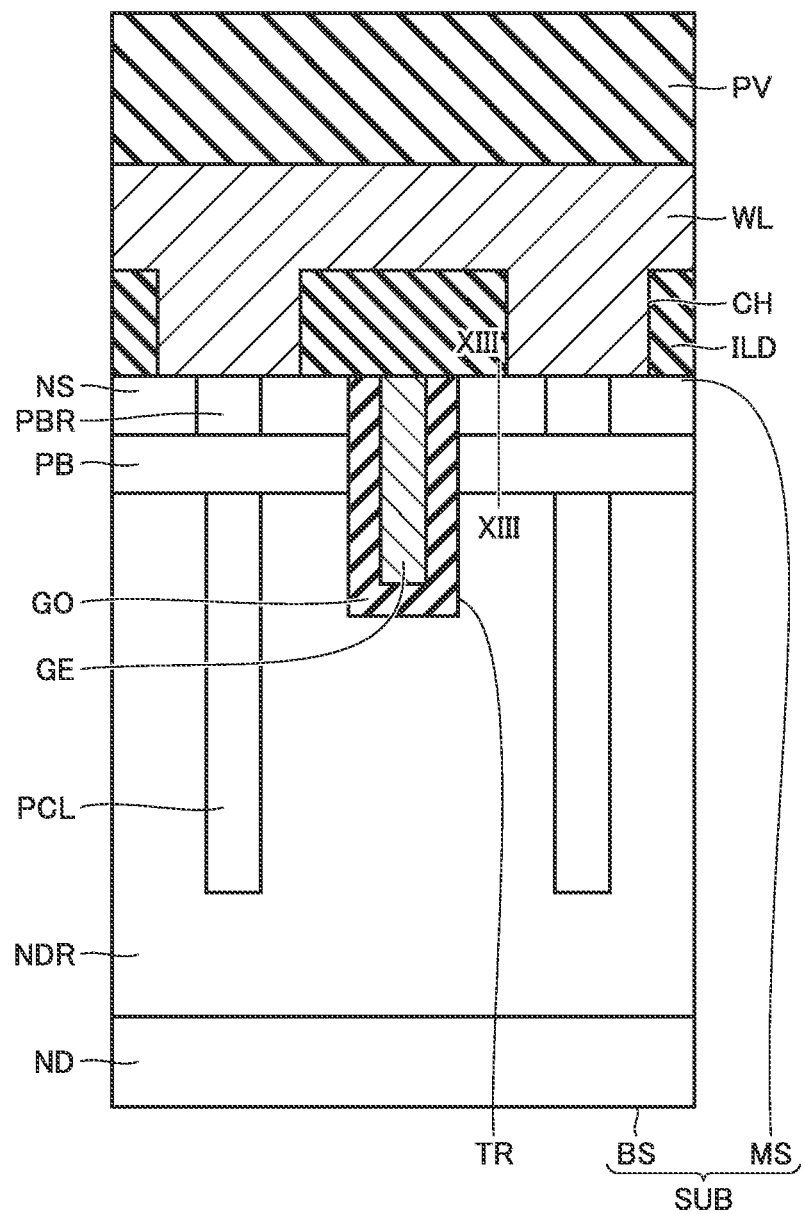
FIG. 12 is a cross-sectional view of a semiconductor device according to a second comparative example.
Figure 13:
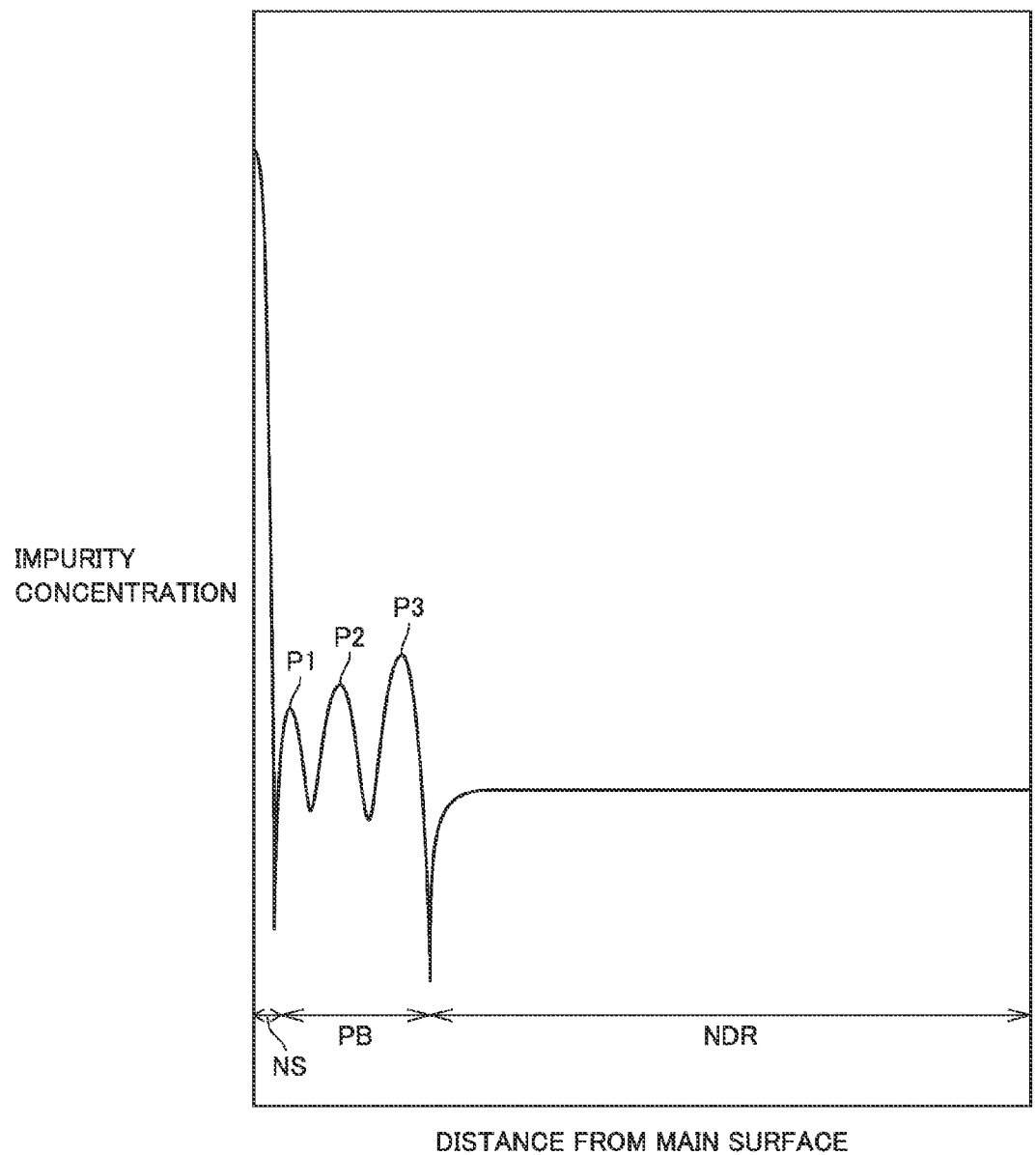
FIG. 13 is a schematic diagram showing change in impurity concentration along XIII-XIII in FIG. 12.

As shown in FIGS. 12 and 13, p-type base region PB in the semiconductor device according to the second comparative example does not have n-type region NR.

Though there are three peak values in the distribution of the impurity concentration in p-type base region PB in the semiconductor device according to the second comparative example, p-type base region PB in the semiconductor device according to the second comparative example has depth D smaller than 1.0 μm. An interval between positions where peak values are attained in the distribution of the impurity concentration is narrow. Therefore, n-type drift region NDR between peaks of the impurity concentration can be converted to the p-type owing to diffusion of an impurity resulting from heat treatment under the conditions as above. Therefore, in the second comparative example, normal p-type base region PB not having n-type region NR can be formed.

In the semiconductor device according to the second comparative example, however, p-type base region PB has depth D smaller than 1.0 µm and hence a channel length is short and a safe operation region is narrow.

An effect of the semiconductor device according to the second embodiment will be described below based on comparison with the first comparative example and the second comparative example.

P-type base region PB in the semiconductor device according to the second embodiment has depth D not smaller than 1.0 µm. There are, however, four or more peak values in the distribution of the impurity concentration in p-type base region PB in the semiconductor device according to the second embodiment, and hence an interval between positions where peaks are attained in the distribution of the impurity concentration is narrow.

Therefore, according to the semiconductor device according to the second embodiment, a region between positions where peak values are attained in the distribution of the impurity concentration is converted to the p-type owing to diffusion of an impurity resulting from heat treatment and n-type region NR does not remain in p-type base region PB. According to the semiconductor device according to the second embodiment, formation of a steep concentration gradient is less likely between positions where peak values are attained in the distribution of the impurity concentration.

Furthermore, in the semiconductor device according to the second embodiment, p-type base region PB has depth D not smaller than 1.0 µm and not greater than 2.0 µm. Therefore, in the semiconductor device according to the second embodiment, a channel length is long and a safe operation region becomes wide.

Third Embodiment

A structure of a semiconductor device according to a third embodiment will be described below. A difference from the second embodiment will mainly be described here.

Figure 14:
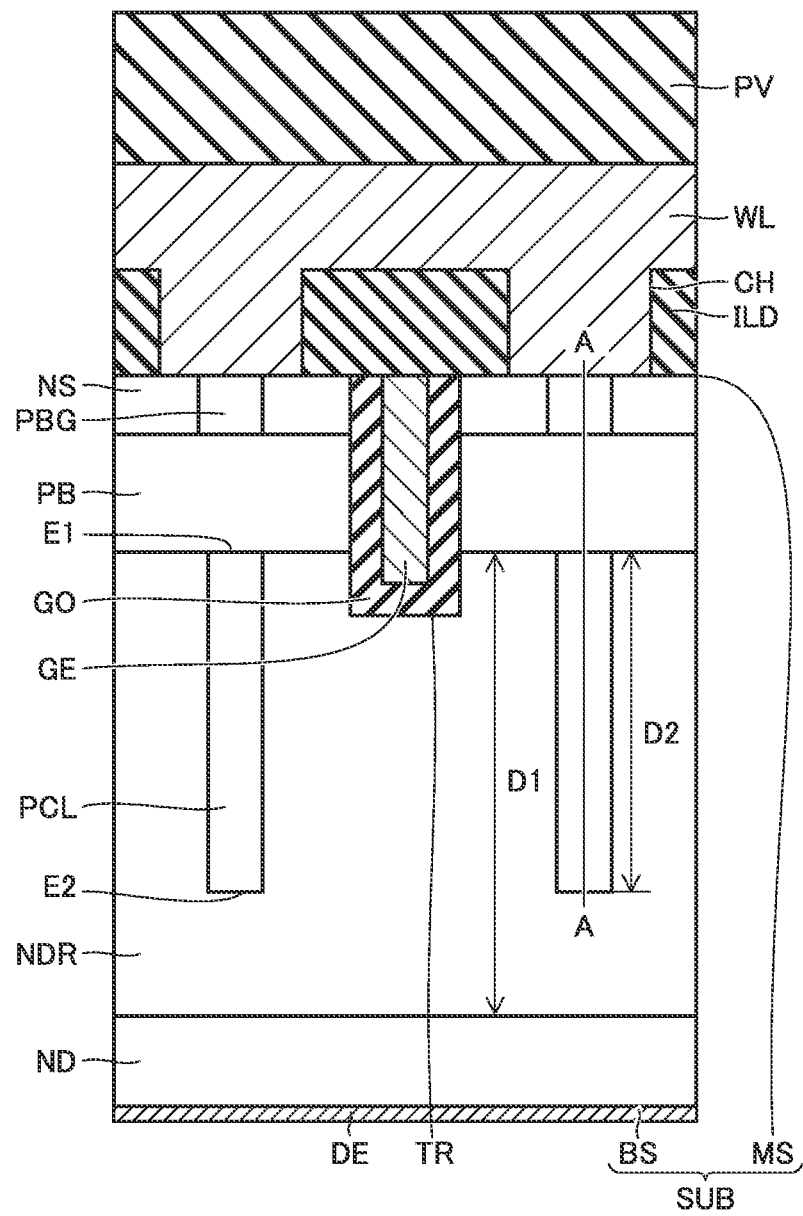
FIG. 14 is a cross-sectional view of a semiconductor device according to a third embodiment.

As shown in FIG. 14, the semiconductor device according to the third embodiment has semiconductor substrate SUB, a MISFET, interlayer insulating film ILD, interconnection WL, and protecting film PV similarly to the semiconductor device according to the second embodiment.

Semiconductor substrate SUB has the MISFET formed as in the semiconductor device according to the second embodiment. The MISFET has n-type drain region ND, n-type drift region NDR, p-type base region PB, and n-type source region NS as in the semiconductor device according to the first embodiment. Semiconductor substrate SUB may have p-type back gate region PBG as in the semiconductor device according to the second embodiment. Semiconductor substrate SUB has p-type column region PCL as in the semiconductor device according to the second embodiment.

The semiconductor device according to the third embodiment, however, is different from the semiconductor device according to the second embodiment in that the number of peak values in a distribution of an impurity concentration in p-type base region PB does not have to be four or more. The semiconductor device according to the third embodiment is different from the semiconductor device according to the second embodiment also in distribution of an impurity concentration in p-type column region PCL.

P-type column region PCL has a first end E1 and a second end E2. First end E1 is an end of p-type column region PCL on a side of p-type base region PB. Second end E2 is an end opposite to first end E1.

A first example of a distribution of an impurity concentration in the semiconductor device according to the third embodiment will be described.

Figure 15:
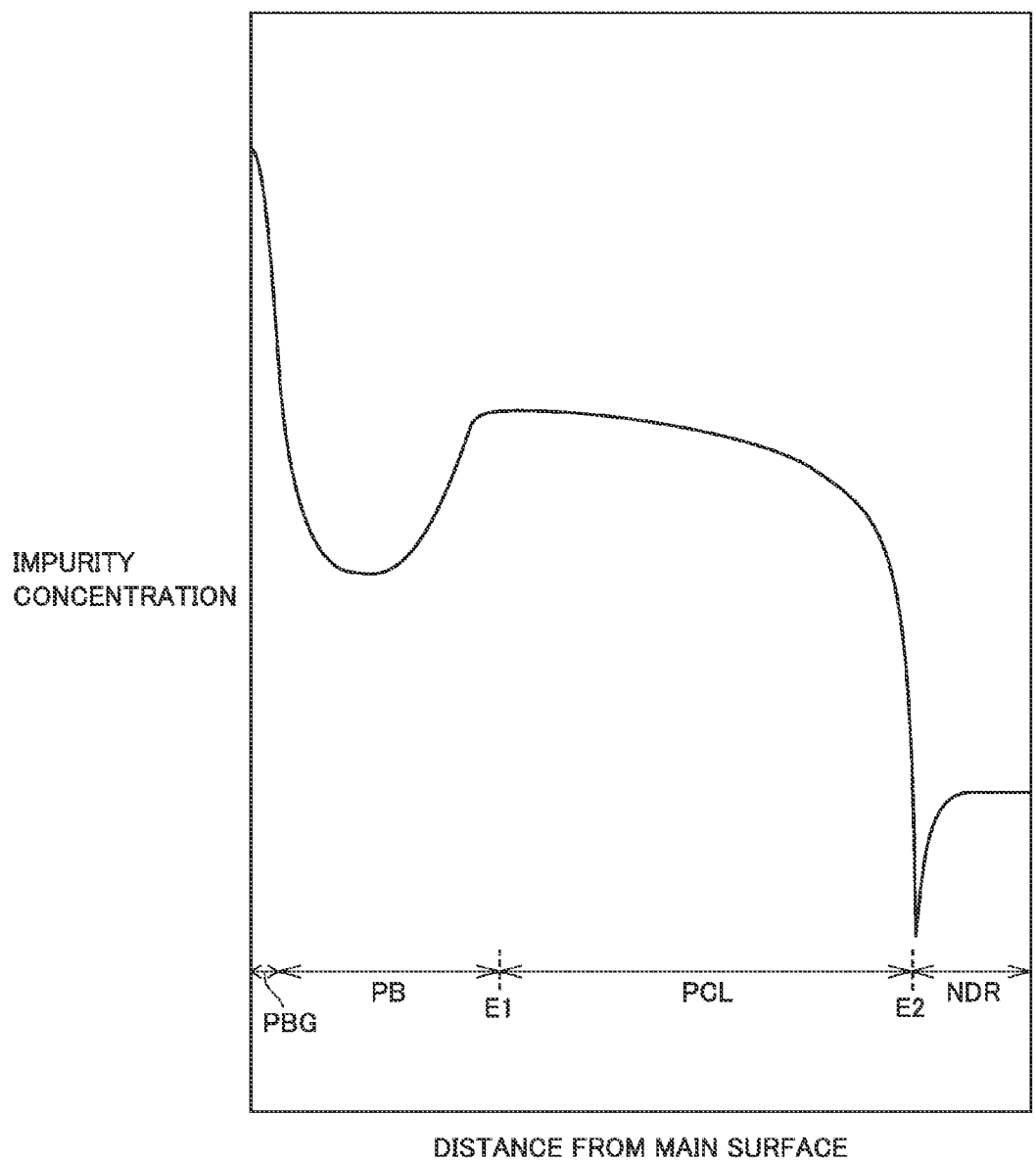
FIG. 15 is a schematic diagram showing a first example of change in impurity concentration along A-A in FIG. 14.

As shown in FIG. 15 (which shows a distribution of an impurity concentration along A-A in FIG. 14), an impurity concentration in p-type column region PCL of the semiconductor device according to the third embodiment attains to the maximum at first end E1. The impurity concentration in p-type column region PCL of the semiconductor device according to the third embodiment may become lower as a distance from first end E1 is greater toward second end E2 (from first end E1 toward second end E2).

A second example of a distribution of an impurity concentration in the semiconductor device according to the third embodiment will be described.

Figure 16:
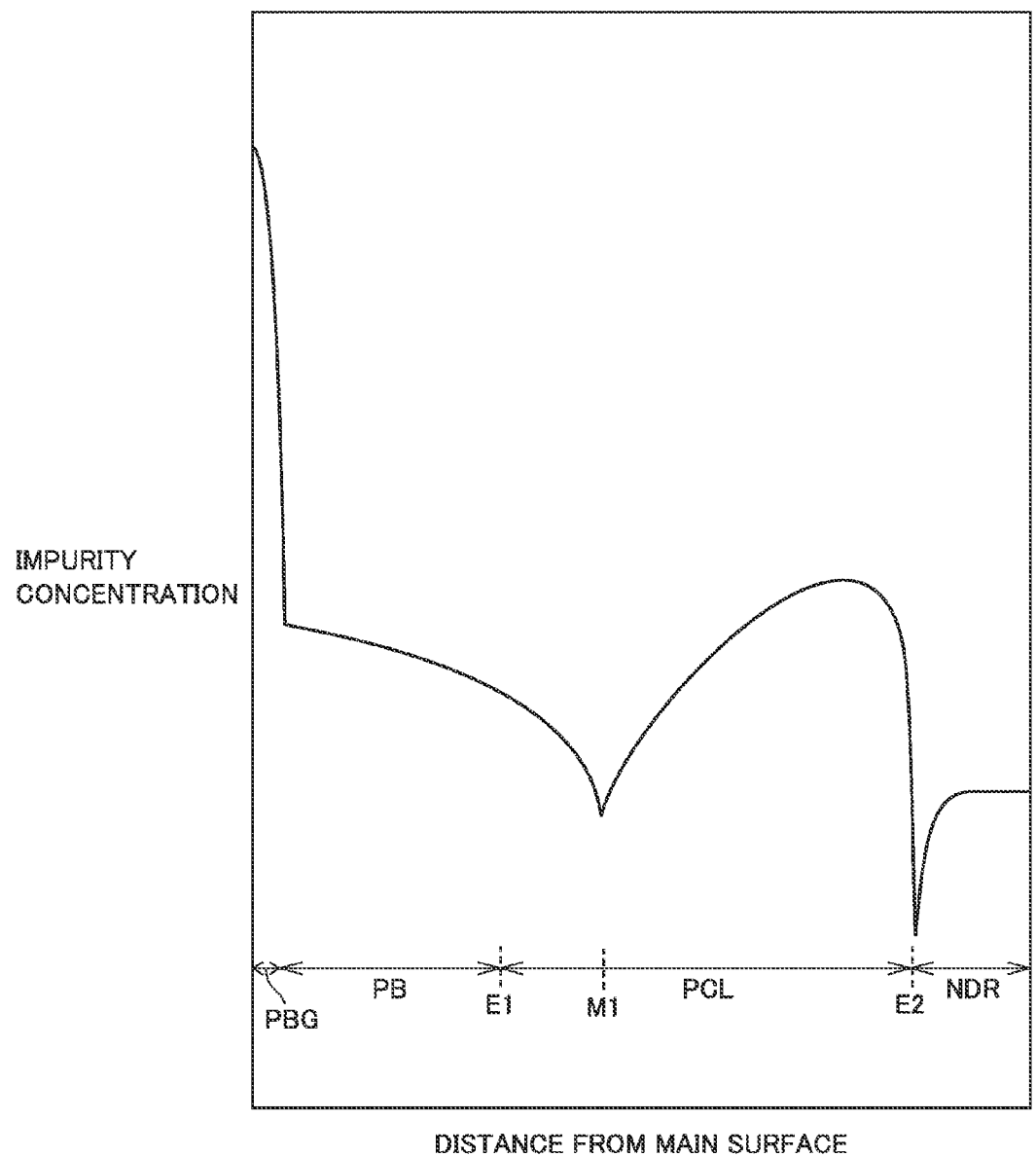
FIG. 16 is a schematic diagram showing a second example of change in impurity concentration along A-A in FIG. 14.

As shown in FIG. 16 (which shows a distribution of an impurity concentration along A-A in FIG. 14), an impurity concentration in p-type column region PCL attains to the minimum at a position M1 located between first end E1 and second end E2. An impurity concentration in p-type column region PCL is higher toward first end E1 from position M1. An impurity concentration in p-type column region PCL does not attain to the maximum at first end E1.

In the second example, the impurity concentration in p-type column region PCL may attain to the maximum around second end E2. The impurity concentration in p-type column region PCL may become higher toward second end E2 from position M1. A distance L between first end E1 and position M1 is preferably not smaller than 0.1 µm and not greater than 0.5 µm. In the second example, the impurity concentration in p-type column region PCL may be higher at first end E1 than the impurity concentration in p-type base region PB.

Figure 17:
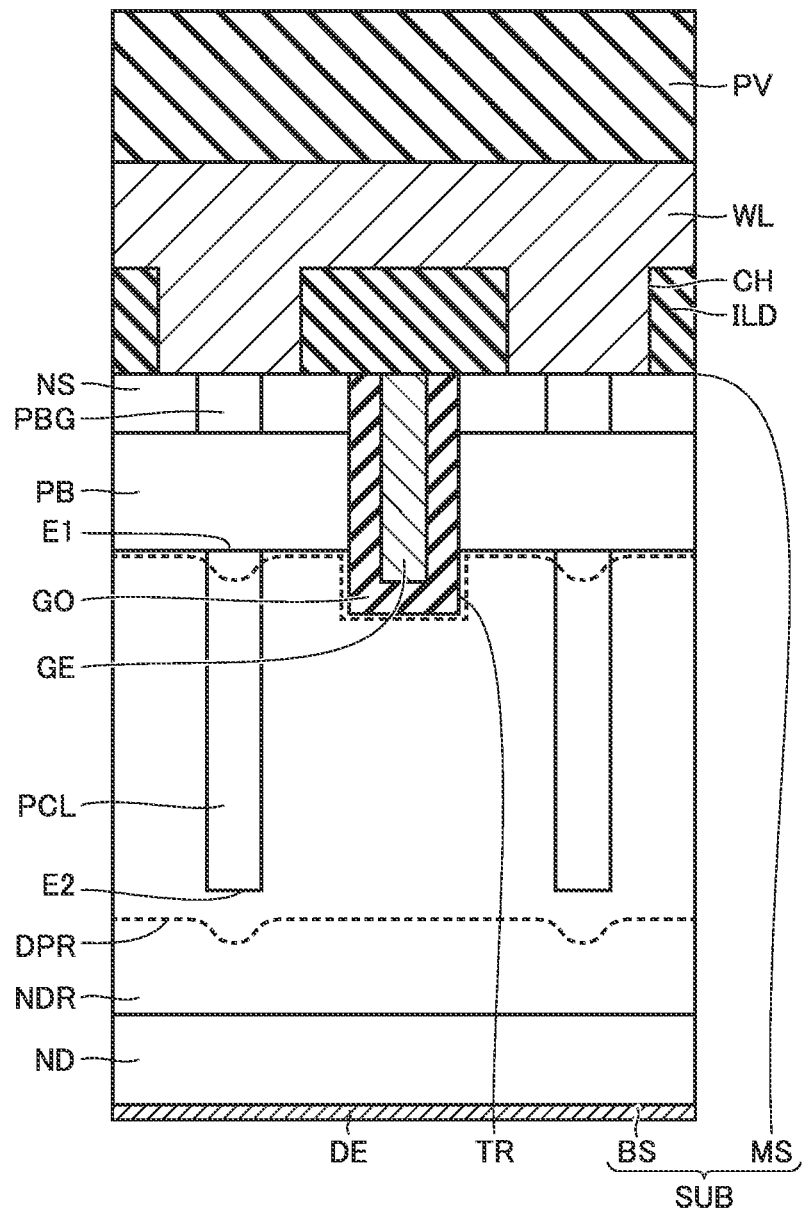
FIG. 17 is a schematic diagram showing a shape of a depletion layer immediately before breakdown due to reverse biasing in the semiconductor device according to the third embodiment.

In a state immediately before breakdown due to reverse biasing, p-type column region PCL and n-type drift region NDR form a depletion layer DPR shown in FIG. 17. Depletion layer DPR is concavely recessed toward back surface BS at a boundary between p-type base region PB and p-type column region PCL as a result of the distribution of the impurity concentration in p-type column region PCL shown in the first example or the second example.

As shown in FIG. 14, n-type drift region NDR has depth D1. P-type column region PCL has depth D2. Depth D1 of the n-type drift region refers to a distance between p-type base region PB and n-type drain region ND and depth D2 of p-type column region PCL refers to a distance between first end E1 and second end E2 of p-type column region PCL. For example, when a breakdown voltage is set to 50 V, depth D1 is preferably not smaller than 1.8 µm and not greater than 2.0 µm and depth D2 is preferably not smaller than 1.8 µm and not greater than 2.0 µm. For example, when a breakdown voltage is set to 46 V, depth D1 is preferably not smaller than 1.6 µm and not greater than 1.8 µm and depth D2 is preferably not smaller than 1.6 µm and not greater than 1.8 µm.

A structure of a semiconductor device according to a modification of the third embodiment will be described below. A difference from the semiconductor device according to the third embodiment will mainly be described below.

Figure 18:
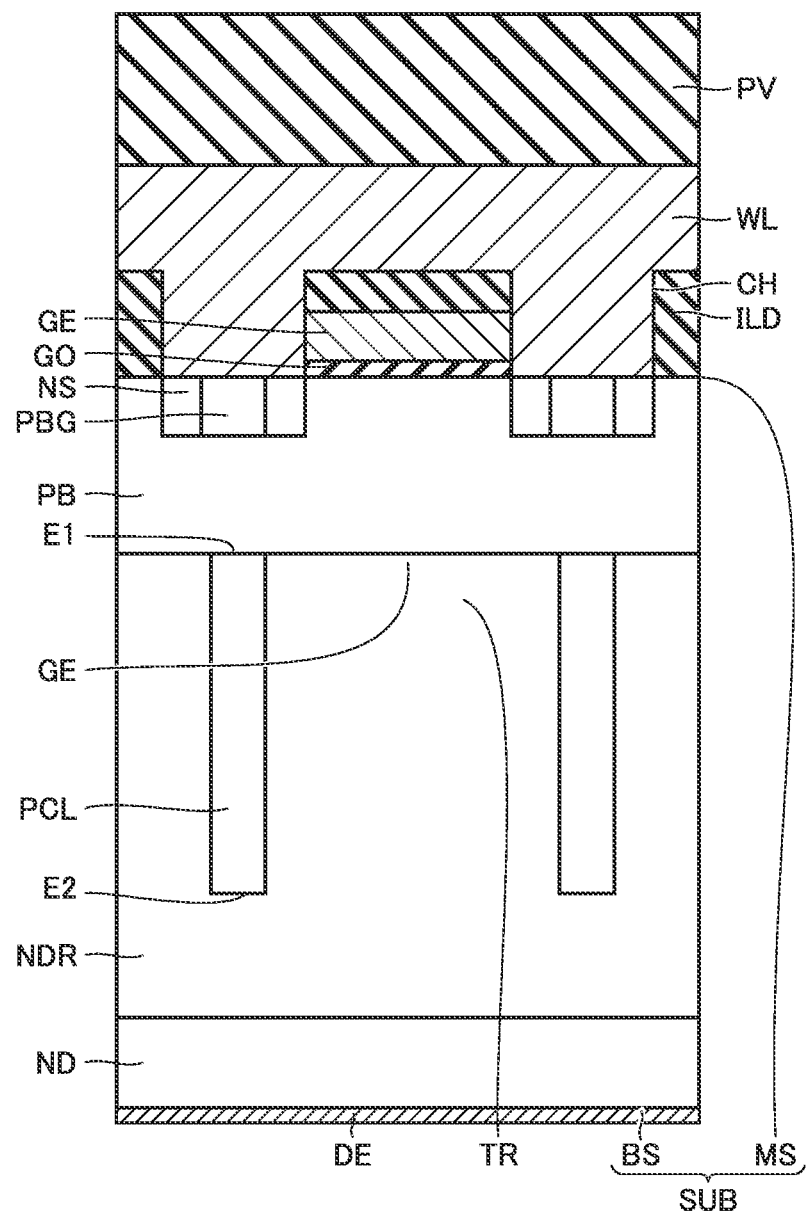
FIG. 18 is a cross-sectional view of a semiconductor device according to a modification of the third embodiment.

As shown in FIG. 18, the semiconductor device according to the modification of the third embodiment has semiconductor substrate SUB, a MISFET, interlayer insulating film ILD, interconnection WL, and protecting film PV similarly to the semiconductor device according to the third embodiment.

Semiconductor substrate SUB has the MISFET formed as in the semiconductor device according to the third embodiment. The MISFET has n-type drain region ND, n-type drift region NDR, p-type base region PB, and n-type source region NS as in the semiconductor device according to the first embodiment. Semiconductor substrate SUB may have p-type back gate region PBG as in the semiconductor device according to the third embodiment. Semiconductor substrate SUB has p-type column region PCL as in the semiconductor device according to the third embodiment.

The semiconductor device according to the modification of the third embodiment, however, is different from the semiconductor device according to the third embodiment in that semiconductor substrate SUB does not have trench TR and a portion of p-type base region PB lying between n-type source regions NS is opposed to gate electrode GE as being insulated from the gate electrode by gate insulating film GO. The semiconductor device according to the modification of the third embodiment is different from the semiconductor device according to the third embodiment which is a trench gate type, in being of a planar type.

A method of manufacturing a semiconductor device according to the third embodiment will be described below.

The method of manufacturing a semiconductor device according to the third embodiment is similar to the manufacturing method according to the second embodiment except for column region forming step S14 and base region forming step S16.

In column region forming step S14 in the method of manufacturing a semiconductor device according to the third embodiment, as in the method of manufacturing a semiconductor device according to the second embodiment, ion implantation and heat treatment are performed a plurality of times. The method of manufacturing a semiconductor device according to the third embodiment is different from the method of manufacturing a semiconductor device according to the second embodiment in that an amount of dose in each of a plurality of times of ion implantation is different. In column region forming step S14 in the method of manufacturing a semiconductor device according to the third embodiment, a plurality of times of ion implantation are set such that an amount of dose increases as a depth from main surface MS of semiconductor substrate SUB is greater.

Base region forming step S16 in the method of manufacturing a semiconductor device according to the third embodiment is different from that in the method of manufacturing a semiconductor device according to the second embodiment in that ions are implanted less than four times.

An effect of the semiconductor device according to the third embodiment will be described below as compared with a comparative example.

Figure 19:
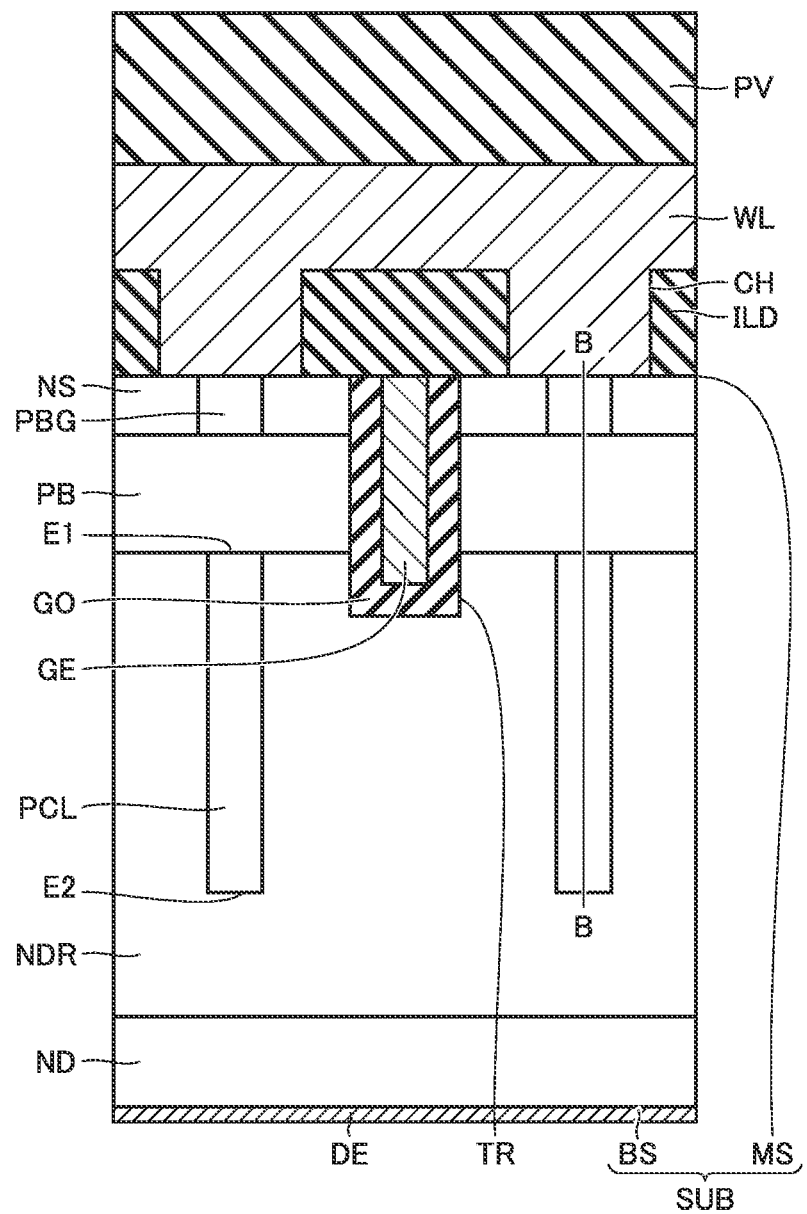
FIG. 19 is a cross-sectional view of a semiconductor device according to a third comparative example.

As shown in FIG. 19, a semiconductor device according to a third comparative example has semiconductor substrate SUB, a MISFET, interlayer insulating film ILD, interconnection WL, and protecting film PV. Semiconductor substrate SUB has the MISFET formed. The MISFET has n-type drain region ND, n-type drift region NDR, p-type base region PB, n-type source region NS, p-type back gate region PBG, and p-type column region PCL. In this regard, the semiconductor device according to the third comparative example is similar to the semiconductor device according to the third embodiment.

Figure 20:
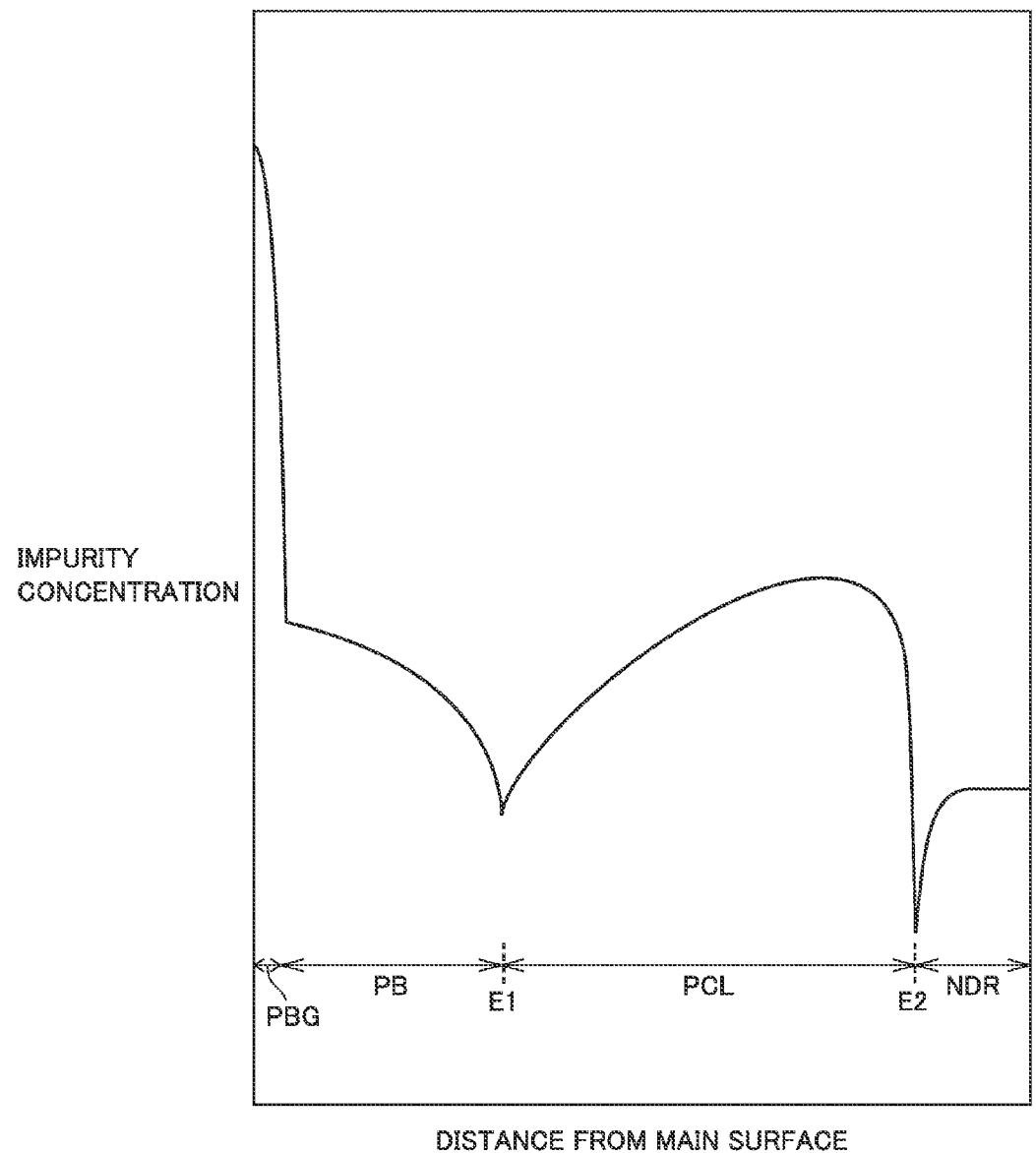
FIG. 20 is a schematic diagram showing change in impurity concentration along B-B in FIG. 19.
Figure 21:
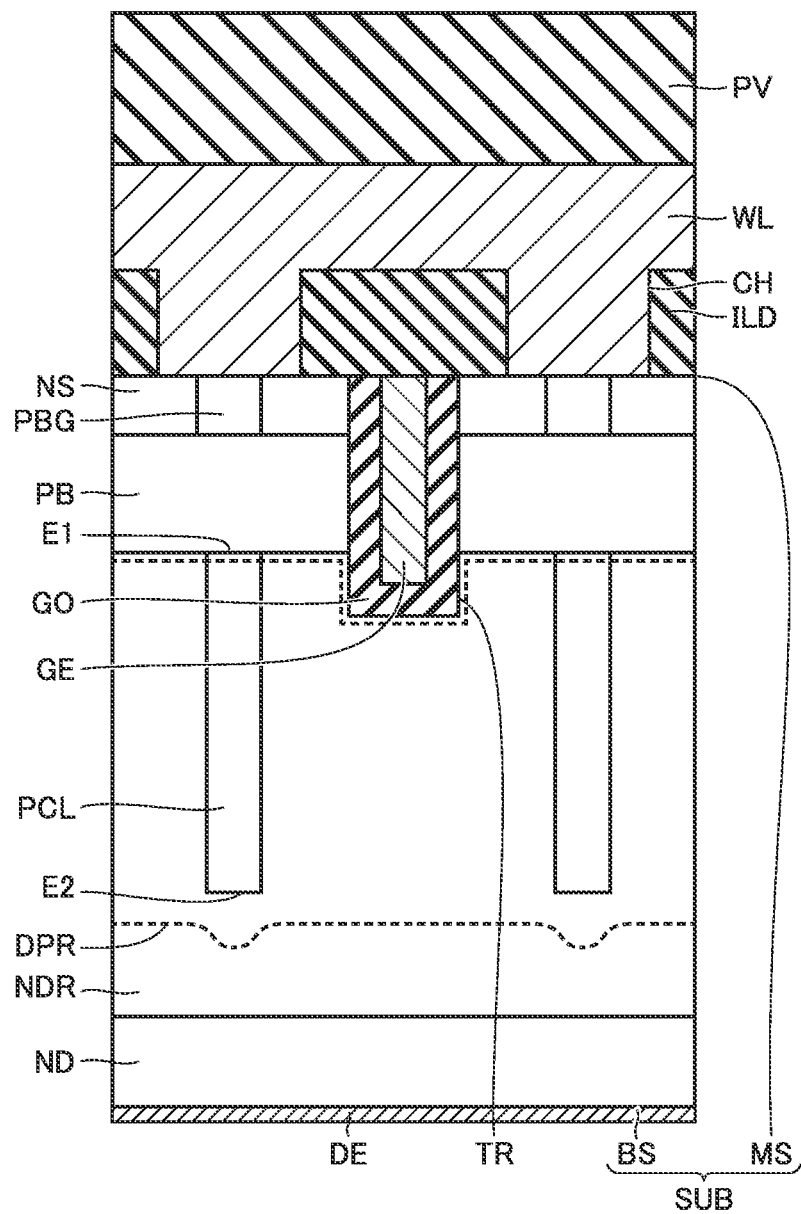
FIG. 21 is a schematic diagram showing a shape of a depletion layer immediately before breakdown due to reverse biasing in the semiconductor device according to the third comparative example.

In the semiconductor device according to the third comparative example, however, as shown in FIG. 20 (which shows a distribution of an impurity concentration along B-B in FIG. 19), an impurity concentration in p-type column region PCL attains to the minimum at first end E1. In the semiconductor device according to the third comparative example, an impurity concentration in p-type column region PCL attains to the maximum at second end E2. Furthermore, in the semiconductor device according to the third comparative example, the impurity concentration in p-type column region PCL is higher toward second end E2 from first end E1. Consequently, in the semiconductor device according to the comparative example, as shown in FIG. 21, in a state immediately before breakdown due to reverse biasing, depletion layer DPR formed by p-type column region PCL and n-type drift region NDR is flat at the boundary between p-type base region PB and p-type column region PCL. In this regard, the semiconductor device according to the third comparative example is different from the semiconductor device in the third embodiment.

Figure 22:
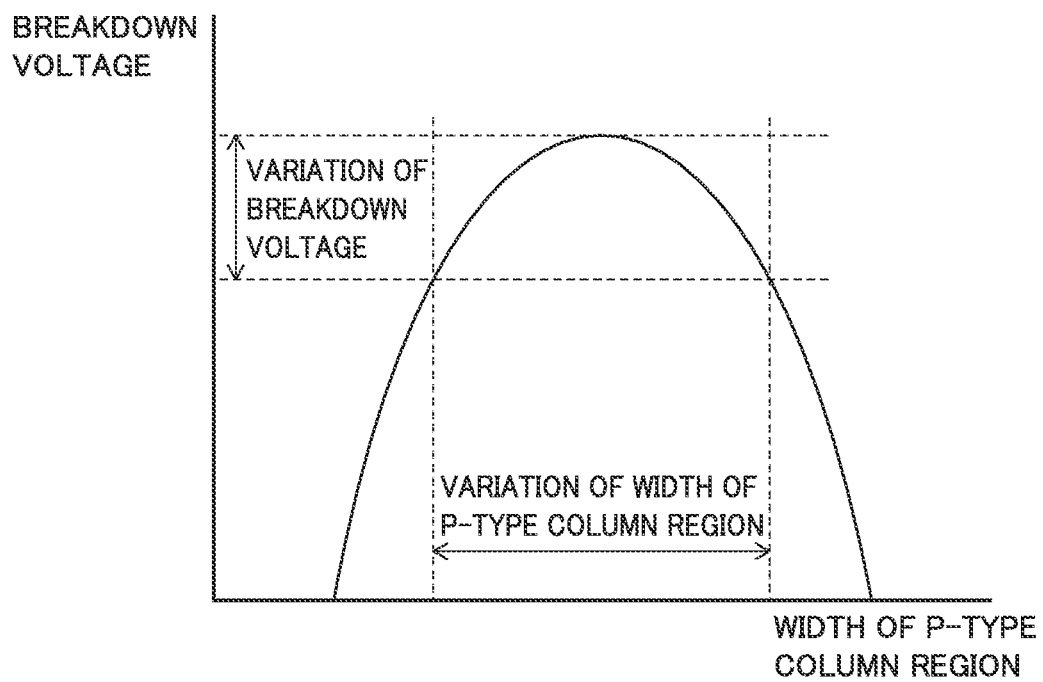
FIG. 22 is a schematic diagram showing relation between a breakdown voltage and a width of a p-type column region in the semiconductor device according to the third comparative example.

In the semiconductor device according to the third comparative example, as set forth above, depletion layer DPR immediately before breakdown is flat at the boundary between p-type base region PB and p-type column region PCL. Therefore, in the semiconductor device according to the third comparative example, concentration of electric field at the boundary between p-type base region PB and p-type column region PCL is less likely and breakdown is less likely to occur. Consequently, a breakdown voltage of the semiconductor device according to the third comparative example is determined by a dimension (a depth or a width) of p-type column region PCL. As shown in FIG. 22, in the semiconductor device according to the third comparative example, for example, as p-type column region PCL is varied, a breakdown voltage is also varied. A breakdown voltage is thus varied due to manufacturing variation in dimension of p-type column region PCL.

Figure 23:
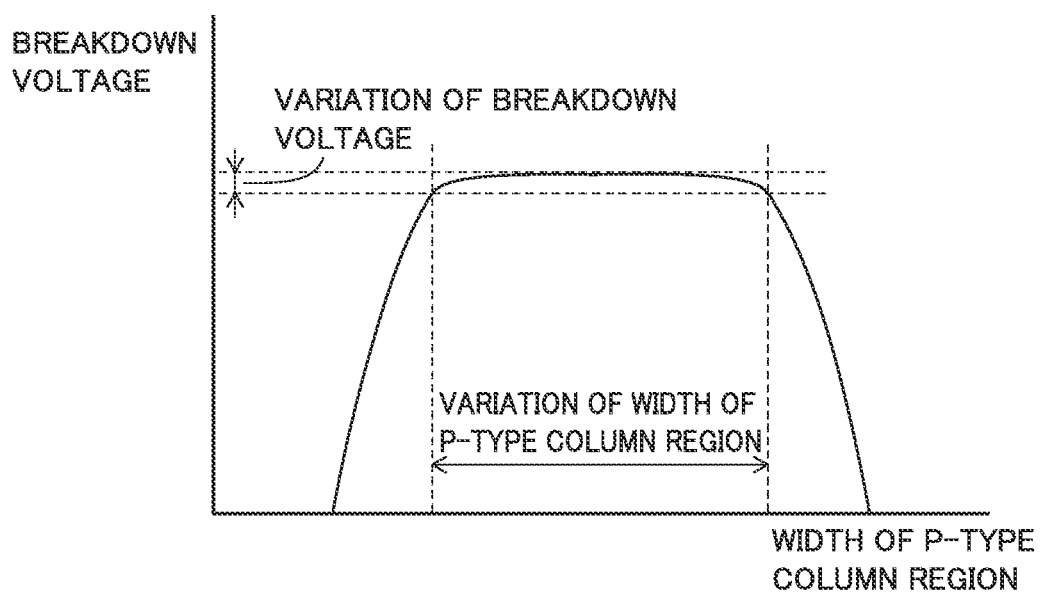
FIG. 23 is a schematic diagram showing relation between a breakdown voltage and a width of a p-type column region in the semiconductor device according to the third embodiment.

In the semiconductor device according to the third embodiment, as set forth above, depletion layer DPR immediately before breakdown is concavely recessed toward back surface BS at the boundary between p-type base region PB and p-type column region PCL. Therefore, in the semiconductor device according to the third embodiment, electric field is concentrated at the boundary between p-type base region PB and p-type column region PCL and breakdown is likely to occur. In the semiconductor device according to the third embodiment, a breakdown voltage can be controlled based on an impurity concentration in p-type column region PCL. An impurity concentration in p-type column region PCL is controlled based on ion implantation which is a step less in variation. Therefore, as shown in FIG. 23, a breakdown voltage of the semiconductor device according to the third embodiment is less likely to be affected by manufacturing variation in dimension of p-type column region PCL. Therefore, with the semiconductor device according to the third embodiment, variation in breakdown voltage can be suppressed.

If an impurity concentration in p-type column region PCL attains to the maximum at first end E1 in the semiconductor device according to the third embodiment, depletion layer DPR will concavely be recessed toward back surface BS at the boundary between p-type base region PB and p-type column region PCL. Therefore, variation in breakdown voltage can be suppressed also in this case.

If an impurity concentration in p-type column region PCL attains to the maximum at first end E1 and becomes lower as a distance from first end E1 is greater in the semiconductor device according to the third embodiment, p-type column region PCL will easily be formed through ion implantation. Therefore, a semiconductor device can readily be manufactured in this case.

If an impurity concentration in p-type column region PCL attains to the minimum at position M1, becomes higher toward first end E1 from position M1, and does not attain to the maximum at first end E1 in the semiconductor device according to the third embodiment, depletion layer DPR will concavely be recessed toward back surface BS at the boundary between p-type base region PB and p-type column region PCL. Therefore, variation in breakdown voltage can be suppressed also in this case.

In the semiconductor device according to the third comparative example, a depth of n-type drift region NDR should be set in consideration of variation in breakdown voltage. Specifically, n-type drift region NDR and p-type column region PCL should be formed to be deep, taking into account a breakdown voltage swinging toward a high breakdown voltage. Consequently, in the third comparative example, an on-resistance increases. In the semiconductor device according to the embodiment, variation in breakdown voltage is less. Therefore, in the semiconductor device according to the third embodiment, it is not necessary to form n-type drift region NDR and p-type column region PCL to excessively be deep in consideration of variation. Therefore, in the semiconductor device according to the third embodiment, when a breakdown voltage is set to 50 V, an on-resistance can be lowered by setting depth D1 to be not smaller than 1.8 µm and not greater than 2.0 µm and setting depth D2 to be not smaller than 1.8 µm and not greater than 2.0 µm (setting depth D1 to be not smaller than 1.6 µm and not greater than 1.8 µm and setting depth D2 to be not smaller than 1.6 µm and not greater than 1.8 µm when a breakdown voltage is set to 46 V).

Fourth Embodiment

A structure of a semiconductor device according to a fourth embodiment will be described below. A difference from the second embodiment will mainly be described below.

Figure 24:
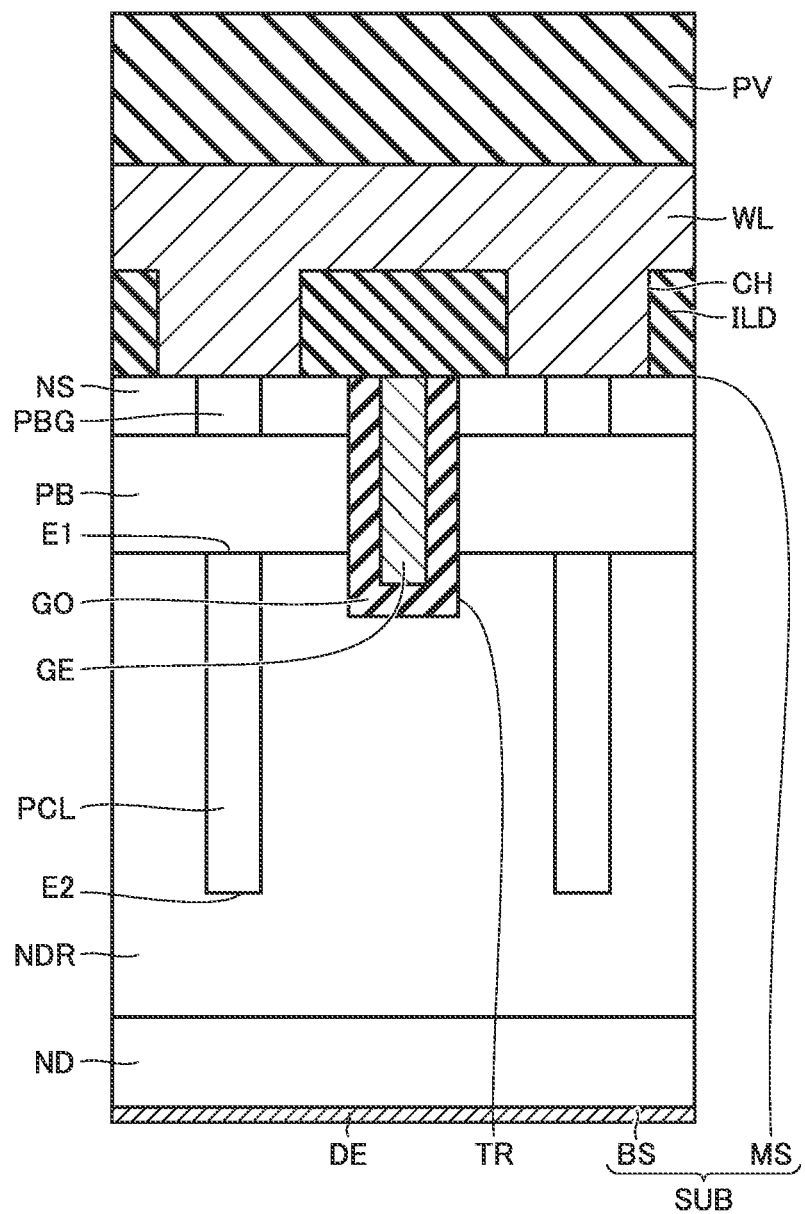
FIG. 24 is a cross-sectional view of a semiconductor device according to a fourth embodiment.

As shown in FIG. 24, the semiconductor device according to the fourth embodiment has semiconductor substrate SUB, a MISFET, interlayer insulating film ILD, interconnection WL, and protecting film PV. Semiconductor substrate SUB has the MISFET formed. The MISFET has n-type drain region ND, n-type drift region NDR, p-type base region PB, and n-type source region NS. Semiconductor substrate SUB may have p-type back gate region PBG. Semiconductor substrate SUB has p-type column region PCL. There are four or more peak values in a distribution of an impurity concentration in p-type base region PB. In this regard, the semiconductor device according to the fourth embodiment is similar to the semiconductor device according to the second embodiment.

The semiconductor device according to the fourth embodiment is different from the semiconductor device according to the second embodiment in distribution of an impurity concentration in p-type column region PCL. In the semiconductor device according to the fourth embodiment, p-type column region PCL has such a distribution of an impurity concentration that a depletion layer formed by p-type column region PCL and n-type drift region NDR while p-type column region PCL and n-type drift region ND are reverse biased is concavely recessed toward back surface BS at the boundary between the p-type column region and p-type base region PB. The semiconductor device according to the fourth embodiment has such a structure that p-type column region PCL in the semiconductor device according to the second embodiment has been replaced with p-type column region PCL in the semiconductor device according to the third embodiment.

A method of manufacturing a semiconductor device according to the fourth embodiment will be described below.

The manufacturing method according to the semiconductor device according to the fourth embodiment is similar to the method of manufacturing a semiconductor device according to the second embodiment except for column region forming step S14. Column region forming step S14 in the method of manufacturing a semiconductor device according to the fourth embodiment is similar to column region forming step S14 in the method of manufacturing a semiconductor device according to the third embodiment.

An effect of the semiconductor device according to the fourth embodiment will be described below.

As set forth above, the semiconductor device according to the fourth embodiment has such a structure that p-type column region PCL in the semiconductor device according to the second embodiment has been replaced with p-type column region PCL in the semiconductor device according to the third embodiment. Therefore, according to the semiconductor device according to the fourth embodiment, a safe operation region of the semiconductor device can be secured while variation in breakdown voltage due to manufacturing variation in dimension of p-type column region PCL is suppressed.

Though the embodiments of the present invention have been described, it should be understood that the embodiments disclosed herein are illustrative and non-restrictive in every respect. The scope of the present invention is defined by the terms of the claims and is intended to include any modifications within the scope and meaning equivalent to the terms of the claims.

What is claimed is:

1. A semiconductor device comprising:
   a semiconductor substrate having a main surface and a back surface opposite to the main surface;
   a drift region of a first conductivity type disposed in the semiconductor substrate;
   a base region of a second conductivity type disposed in the semiconductor substrate on a side of the main surface relative to the drift region;
   a source region of the first conductivity type disposed in the semiconductor substrate on the side of the main surface relative to the drift region such that the base region lies between the source region and the drift region; and
   a gate electrode disposed in the base region lying between the source region and the drift region, with the gate electrode being insulated from the base region,
   the semiconductor substrate having a trench in the main surface,
   the gate electrode being formed in the trench,
   a distribution of an impurity concentration in the base region having a plurality of peak values along a direction of a depth from the main surface toward the back surface, and
   the number of peak values being four or more, wherein
   the semiconductor device further comprises a column region of the second conductivity type extending from the base region toward the back surface in the semiconductor substrate,
   an impurity concentration in the column region is higher than any of the plurality of peak values in the distribution of the impurity concentration in the base region, and
   the plurality of peak values in the distribution of the impurity concentration in the base region are closer to the impurity concentration in the column region as a distance from the main surface is greater.

2. The semiconductor device according to claim 1, wherein
the drift region has an impurity concentration not lower than $1\times10^{16}/cm^3$ and not higher than $1\times10^{17}/cm^3$.

3. The semiconductor device according to claim 1, wherein
the column region includes a first end which is an end on a side of the base region and a second end which is an end opposite to the first end, and
an impurity concentration in the column region attains to a maximum at the first end.

4. The semiconductor device according to claim 3, wherein
the impurity concentration in the column region lowers as a distance from the first end is greater.

5. The semiconductor device according to claim 1, wherein
the column region includes a first end which is an end on a side of the base region and a second end which is an end opposite to the first end, and
an impurity concentration in the column region attains to a minimum at a position between the first end and the second end, becomes higher from the position between the first end and the second end toward the first end, and does not attain to a maximum at the first end.

6. The semiconductor device according to claim 1, wherein
the base region has a depth not smaller than 1.0 μm and not greater than 2.0 μm.

7. The semiconductor device according to claim 6, wherein
the base region has the depth not smaller than 1.5 μm and not greater than 2.0 μm.

8. The semiconductor device according to claim 1, wherein
a peak value other than the peak value located closest to the main surface is maximum of the plurality of peak values in the distribution of the impurity concentration in the base region.

9. The semiconductor device according to claim 8, wherein
the plurality of peak values in the distribution of the impurity concentration in the base region exhibit increase with a greater distance from the main surface.

10. The semiconductor device according to claim 9, wherein
the plurality of peak values in the distribution of the impurity concentration in the base region exhibit linear increase in accordance with a distance from the main surface.

11. The semiconductor device according to claim 10, wherein
positions where the plurality of peak values are attained in the distribution of the impurity concentration in the base region are disposed at an equal interval along the direction of depth.

12. The semiconductor device according to claim 1, wherein
the semiconductor substrate has a back gate region formed as being in contact with the main surface above the drift region and surrounded by the source regions.

* * * * *